(12) United States Patent
Koduri et al.

(10) Patent No.: US 11,094,616 B2
(45) Date of Patent: Aug. 17, 2021

(54) MULTI-PITCH LEADS

(71) Applicant: TEXAS INSTRUMENTS INCORPORATED, Dallas, TX (US)

(72) Inventors: Sreenivasan K. Koduri, Allen, TX (US); Nazila Dadvand, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 61 days.

(21) Appl. No.: 16/543,238

(22) Filed: Aug. 16, 2019

(65) Prior Publication Data

US 2021/0050287 A1  Feb. 18, 2021

(51) Int. Cl.
*H01L 23/495* (2006.01)
*H01L 21/48* (2006.01)
*H01L 23/00* (2006.01)
*H01L 21/56* (2006.01)
*C25D 7/00* (2006.01)
*H01L 23/31* (2006.01)

(52) U.S. Cl.
CPC ......... *H01L 23/49562* (2013.01); *C25D 7/00* (2013.01); *H01L 21/4821* (2013.01); *H01L 21/56* (2013.01); *H01L 23/3107* (2013.01); *H01L 23/49582* (2013.01); *H01L 24/14* (2013.01); *H01L 2224/14177* (2013.01)

(58) Field of Classification Search
CPC ............... H01L 23/49562; H01L 24/14; H01L 21/4821; H01L 23/49582; H01L 21/56; H01L 23/3107; H01L 2224/14177; C25D 7/00
See application file for complete search history.

(56) References Cited

U.S. PATENT DOCUMENTS 7,705,476 B2 * 4/2010 Bayan .................... H01L 24/15
257/787

* cited by examiner

*Primary Examiner* — Kyoung Lee
(74) *Attorney, Agent, or Firm* — Dawn Jos; Charles A. Brill; Frank D. Cimino

(57) ABSTRACT

In some examples, a system comprises a die having multiple electrical connectors extending from a surface of the die and a lead coupled to the multiple electrical connectors. The lead comprises a first conductive member; a first non-solder metal plating stacked on the first conductive member; an electroplated layer stacked on the first non-solder metal plating; a second non-solder metal plating stacked on the electroplated layer; and a second conductive member stacked on the second non-solder metal plating, the second conductive member being thinner than the first conductive member. The system also comprises a molding to at least partially encapsulate the die and the lead.

25 Claims, 29 Drawing Sheets

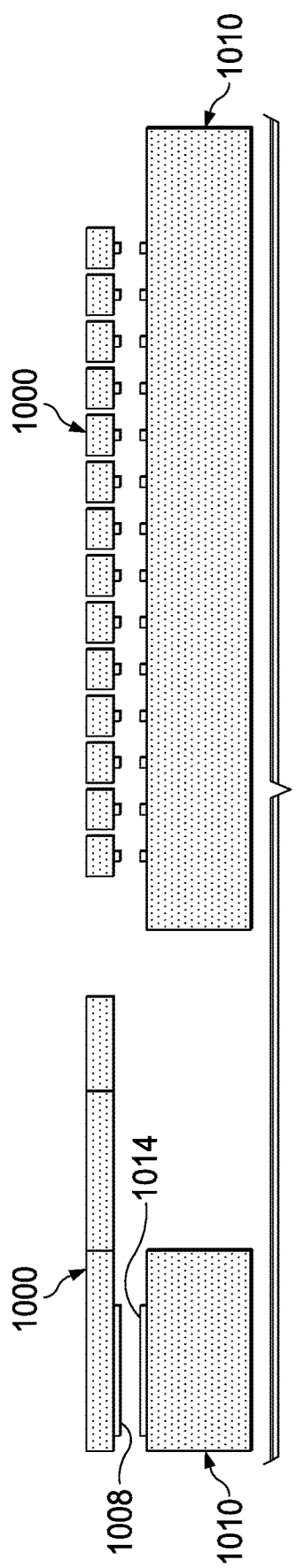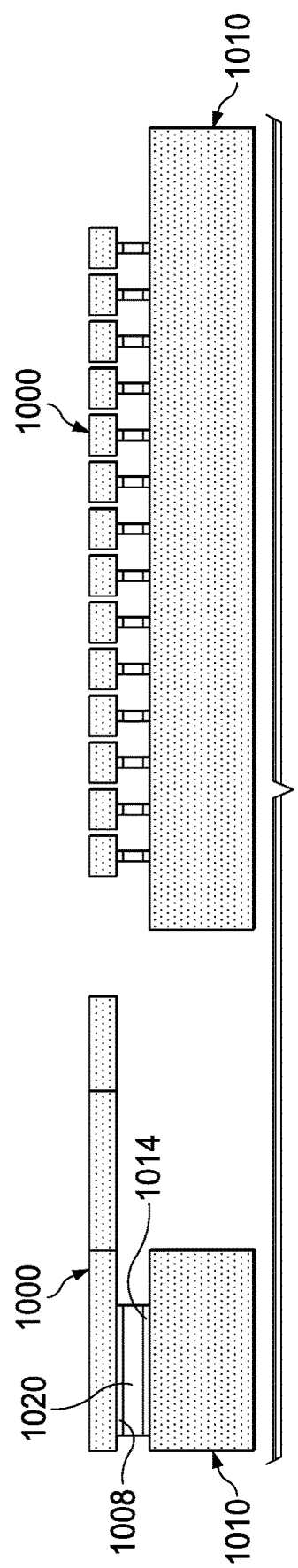

MULTI-PITCH LEADS

SUMMARY

In some examples, a system comprises a die having multiple electrical connectors extending from a surface of the die and a lead coupled to the multiple electrical connectors. The lead comprises a first conductive member; a first non-solder metal plating stacked on the first conductive member; an electroplated layer stacked on the first non-solder metal plating; a second non-solder metal plating stacked on the electroplated layer; and a second conductive member stacked on the second non-solder metal plating, the second conductive member being thinner than the first conductive member. The system also comprises a molding to at least partially encapsulate the die and the lead.

In some examples, a method comprises coupling a first set of leads to multiple electrical connectors extending from a surface of a die, where the first set of leads having leads arranged in multiple rows. The method also comprises selectively plating a second set of leads to produce metal plates using a non-solder metal, the second set of leads having multiple portions and being thicker than the first set of leads. The method further includes coupling the metal plates of the second set of leads to the multiple rows using a non-solder metal. The method also comprises applying a molding to at least partially encapsulate the first and second sets of leads.

BRIEF DESCRIPTION OF THE DRAWINGS

For a detailed description of various examples, reference will now be made to the accompanying drawings in which:

FIG. 10H depicts a side view of a set of leads of a leadframe aligned with a set of leads of another leadframe, the sets of leads having an insulative coating, in accordance with various examples.

FIG. 10I depicts a side view of a set of leads of a leadframe coupled to a set of leads of another leadframe, the sets of leads having an insulative coating, in accordance with various examples.

DETAILED DESCRIPTION

Figure 2:
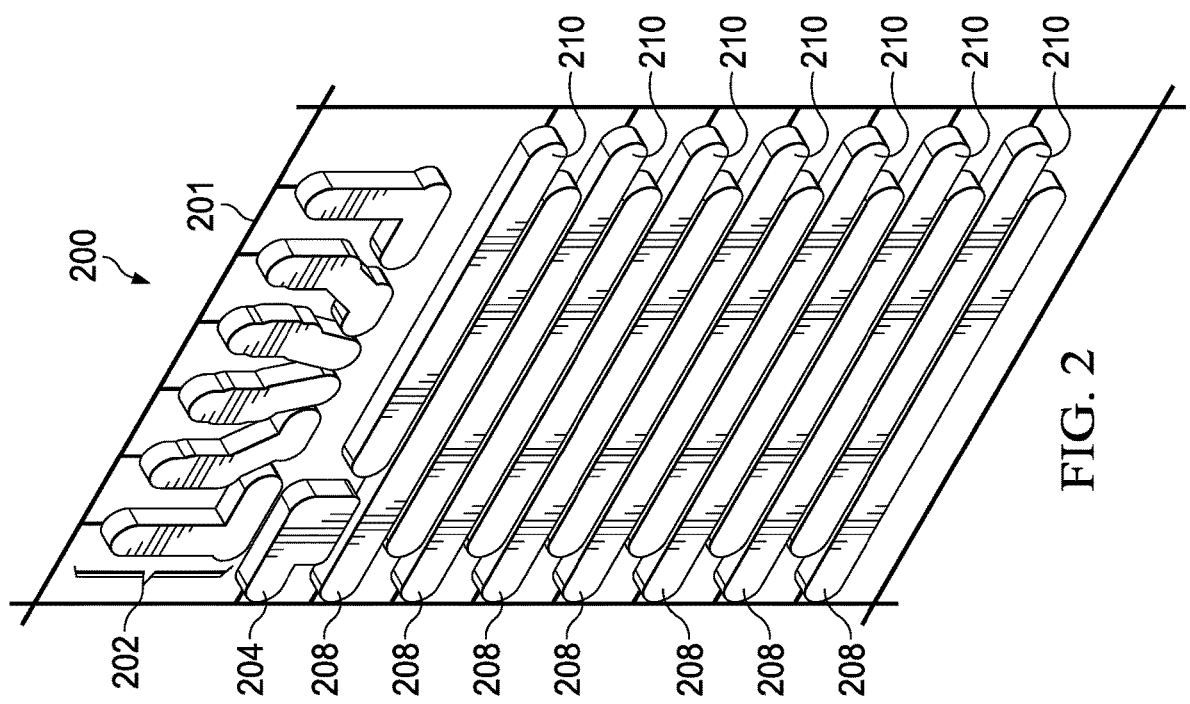
FIG. 2 depicts a perspective view of a set of leads of a leadframe, in accordance with various examples.

This disclosure presents multiple technically advantageous solutions to technical problems that arise with the use of certain types of packaged devices, such as power field effect transistors (FETs). In particular, such devices are sometimes packaged in a manner that undesirably promotes the deterioration of electrical connections between the device and a printed circuit board (PCB) (or other device), thus reducing the life of the device and increasing costs. This problem typically arises from the design of the lead frame that is used to package the device. Such lead frames have leads that are arranged in rows, and these leads are exposed to a surface of the package so that the leads can be electrically coupled to a PCB. The rows are half-etched in an alternating manner such that the pitch between rows is increased (e.g., doubled) relative to the pitch that would otherwise be present, thus precluding the use of rows with an unacceptably fine pitch. Solder is then used to electrically couple the non-etched portion of each row to a PCB or other device.

The configuration described above is problematic at least because current that passes between the packaged device and the PCB flows through a relatively narrow portion of each lead—that is, through the non-etched portion of each lead. This narrowed pathway concentrates the current, which has deleterious effects on the solder joint to which the non-etched portion of the lead couples. For example, the heat generated by this concentrated flow of current damages the solder joint. After an undesirably short period of time, the joint—and possibly the lead itself—can be damaged and can render the packaged device inoperable for its intended purpose.

This disclosure describes various examples of an improved packaging configuration for the devices (e.g., power FETs) described above. The improved packaging configuration omits the aforementioned lead frame with half-etched leads and instead uses a first lead frame with non-etched leads. The leads of this first lead frame are electrically coupled to leads of a second lead frame using a non-solder material (e.g., any metal other than solder). In examples, the leads of the second lead frame are substantially thicker than the leads of the first lead frame. In examples, the leads of the second lead frame are fewer in number than the leads of the first lead frame. In examples, the leads of the second lead frame are positioned substantially orthogonal (e.g., within 10 degrees of orthogonal) to the leads of the first lead frame. Each lead in the second lead frame couples to alternating leads in the first lead frame, such that the leads in the second lead frame do not couple to any lead in common in the first lead frame. Some or all of one or both lead frames are then encapsulated in a molding material (e.g., epoxy), thus forming a complete device. At least the leads of the second lead frame are exposed to a surface of the package to facilitate electrical connections to a PCB or other device (e.g., using solder).

Because half-etching is omitted, current is not concentrated as described above, and thus the deleterious effects on the structures of the packaged device are mitigated. In addition, because in some examples solder is only used to couple the relatively large leads of the second lead frame to the PCB, the current is distributed over a wider lead surface area than would be the case with the leads in the first lead frame, thereby mitigating the deleterious effects on the solder joints and preserving the structural integrity of the packaged device. Example packaging configurations are now described in detail with respect to the drawings.

Figure 1:
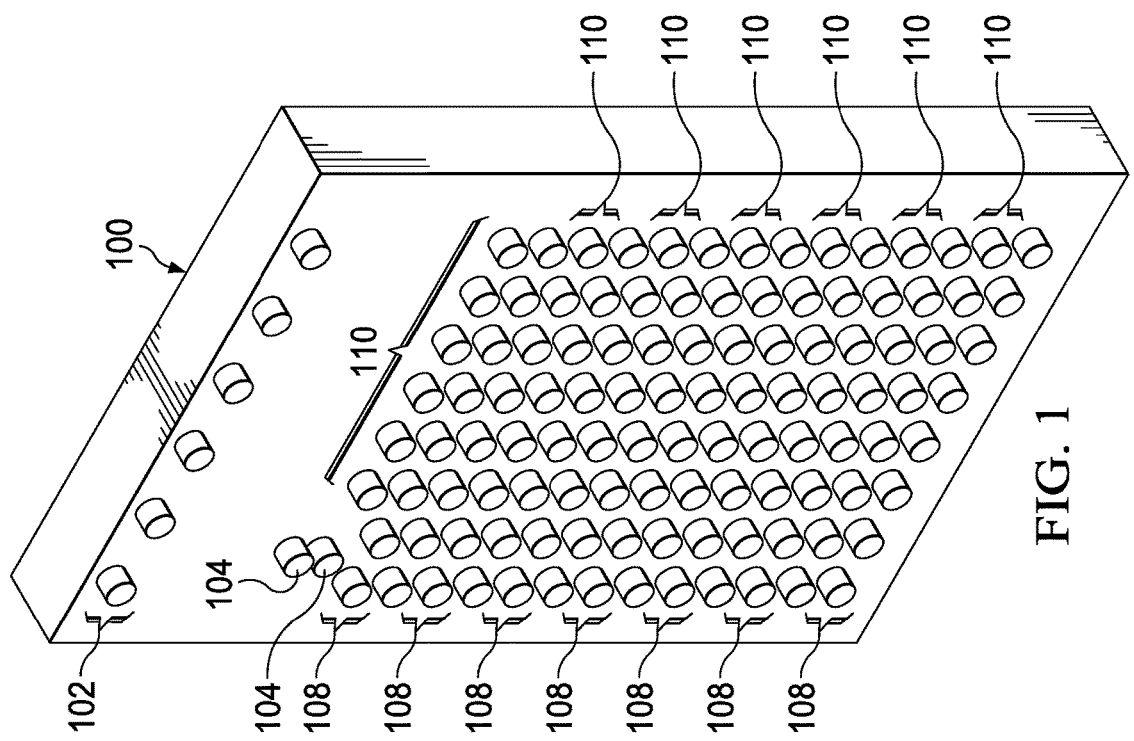
FIG. 1 depicts a perspective view of a die having multiple electrical connectors, in accordance with various examples.

FIG. 1 depicts a perspective view of a die 100 in accordance with various examples. In some examples, the die 100 comprises a power transistor, such as a power FET. In other examples, the die 100 comprises other types of devices. The die 100 includes multiple electrical connectors that couple to active portions of the die 100, such as the source and drain terminals of a power FET. For example, electrical connectors 108 couple to the source terminal of the power FET, while electrical connectors 110 couple to the drain terminal of the power FET. Electrical connectors 108 and 110 are arranged in alternating rows, as shown. In this example, electrical connectors 104 couple to the source terminal of the power FET. Electrical connectors 102 couple to, e.g., areas of the die 100 that generate data and control signals. In some examples, the electrical connectors comprise copper. In some examples, the electrical connectors are cylindrical. In some examples, the electrical connectors are cuboidal. Other compositions and shapes are contemplated and included within the scope of this disclosure. In some examples, the pitch between the rows containing electrical connectors 108 and the rows containing electrical connectors 110 is approximately 50 microns.

FIG. 2 depicts a perspective view of a first set of leads of a leadframe 200, in accordance with various examples. The leadframe 200 includes leads 208 and 210 arranged in an alternating configuration, as shown. The leadframe 200 further comprises a lead 204 and leads 202. A dam bar 201 connects the leads 202, 204, 208, and 210 together. In examples, the leadframe 200 comprises bare copper. In examples, the leadframe 200 comprises a plated metal, e.g., an electroplated copper leadframe. Because the various portions of the leadframe 200 are in electrical contact, electroplating is a viable plating technique. As shown, in some examples, the leads 208 and 210 have a rectangular shape with rounded edges. In some examples, the leads 208 and 210 have a rectangular shape with non-rounded edges, or with rounded and non-rounded edges. In some examples, the leads 202 have a fanned-out shape as depicted. In some examples, the lengths of the leads 208 are similar (i.e., within a reasonable tolerance as judged by one of ordinary skill in the art, such as +/−5 millimeters) to the lengths of the rows containing electrical connectors 108. In some examples, the lengths of the leads 210 are similar to the lengths of the rows containing electrical connectors 110. In some examples, the pitch between the leads 208 and 210 is approximately 500 microns. In examples, the leads 208 and 210 are approximately 2 millimeters long and approximately 300 microns wide.

Figure 3:
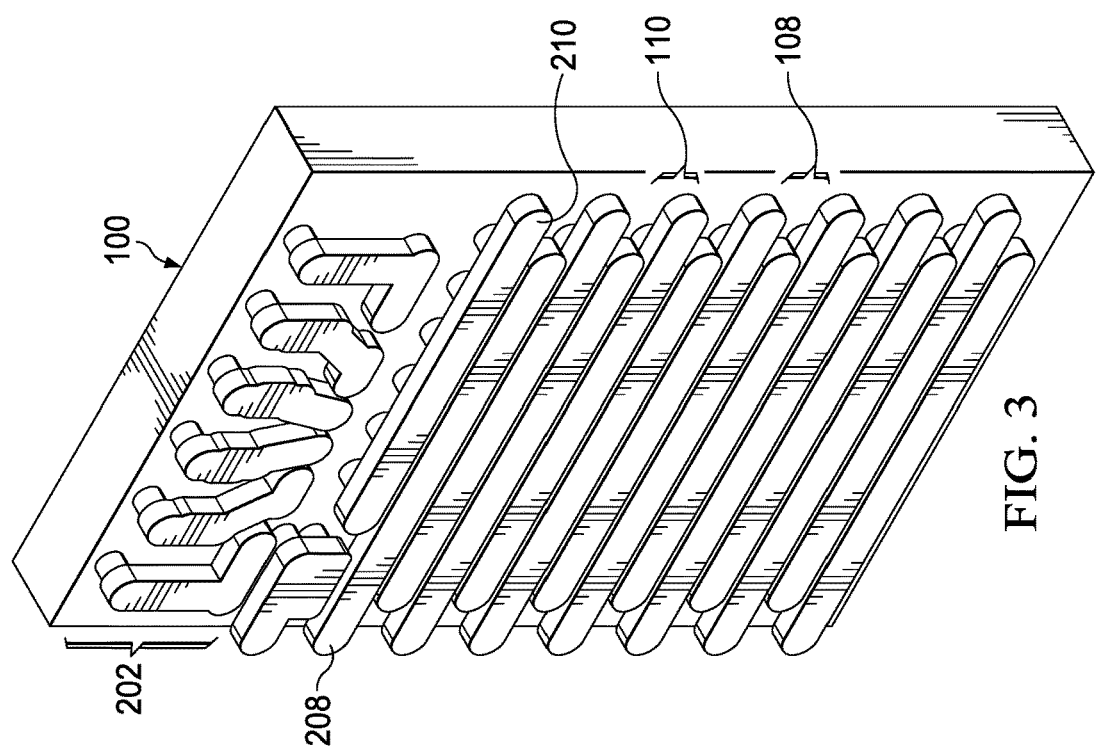
FIG. 3 depicts a perspective view of a set of leads of a leadframe coupled to a die having multiple electrical connectors, in accordance with various examples.

FIG. 3 depicts the leads of FIG. 2 coupled to the die 100 of FIG. 1, in accordance with various examples. As shown, each lead 208 couples to a corresponding row containing electrical connectors 108. Similarly, each lead 210 couples to a corresponding row containing electrical connectors 110. The lead 204 couples to the electrical connector 104, and the leads 202 couple to the electrical connectors 102. In examples, the foregoing connections are established using solder, although other conductive substances (e.g., metals, alloys) are contemplated and included within the scope of this disclosure. In FIG. 3 and subsequent figures, the dam bar 201 is not depicted for clarity and ease of explanation.

Figure 4A:
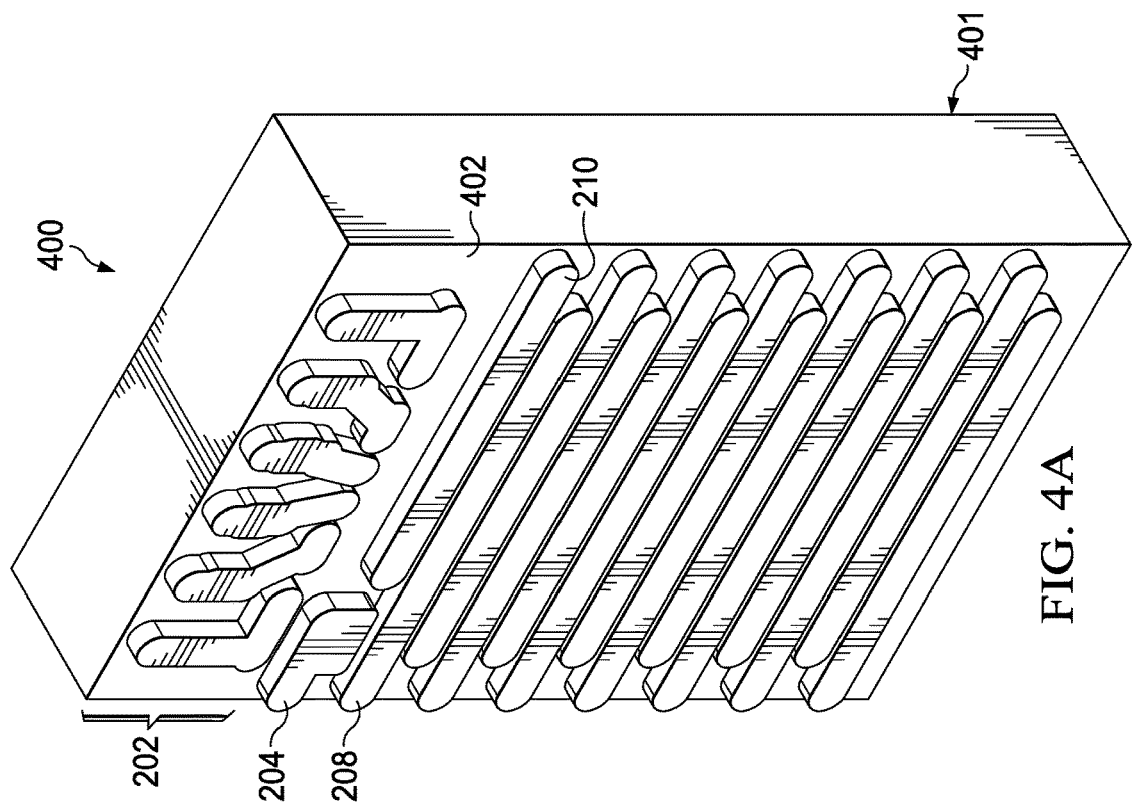
FIG. 4A depicts a perspective view of a package having multiple leads, in accordance with various examples.
Figure 4B:
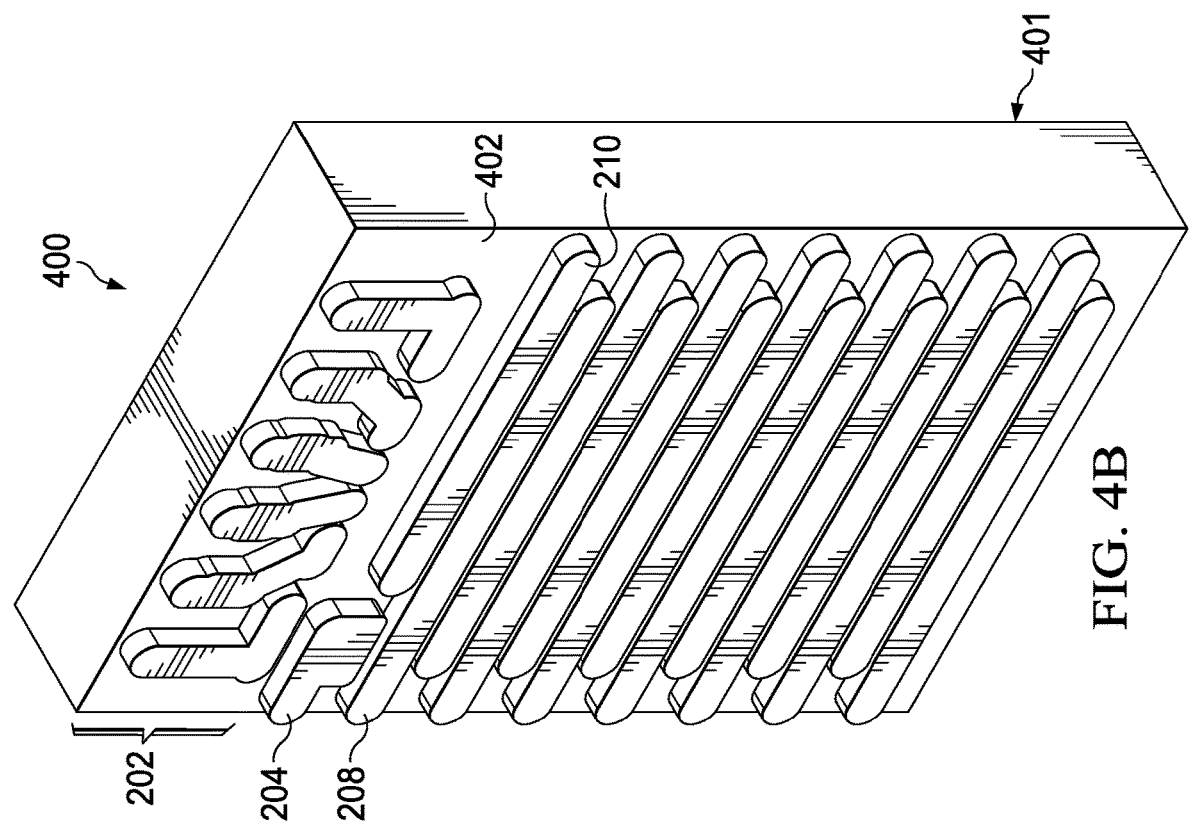
FIG. 4B depicts a perspective view of a package having multiple leads, in accordance with various examples.

FIG. 4A depicts a perspective view of a package 400, in accordance with various examples. The package 400 includes the assembly depicted in FIG. 3 that is at least partially encapsulated in a molding 401 (e.g., epoxy). In examples, the leads 202, 204, 208, and 210 of FIG. 3 are exposed to a surface 402 of the package 400. In examples, the leads 202, 204, 208, and 210 are not half-etched—in other words, the exposed portions of the leads have a uniform thickness. Thus, in such examples, the exposed surfaces of the leads may be uniformly flush with the surface 402 of the package 400. Similarly, in such examples, if the leads are raised above the surface 402 of the package 400, the leads have a uniform thickness (e.g., 50 microns) above the surface 402. The scope of this disclosure is not necessarily limited to any particular thickness of the leads or any particular degree of uniformity between the leads. For instance, leads with "uniform" thicknesses may have thicknesses that are not identical but that are sufficiently similar to achieve the objectives described in this disclosure. FIG. 4B depicts a perspective view of another example of the package 400. In this view, the package 400 and its leads have different dimensions than those shown in FIG. 4A.

Figure 5A:
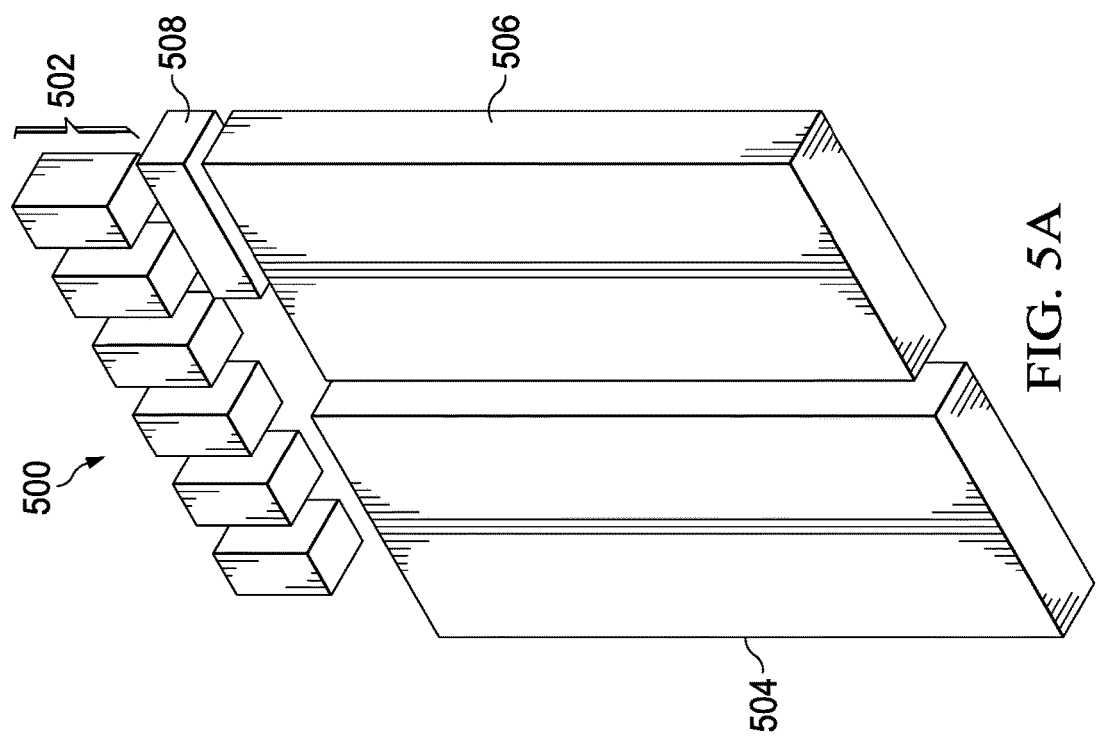
FIG. 5A depicts a perspective view of a set of leads in accordance with various examples.

FIG. 5A depicts a perspective view of a set of leads 500 in accordance with various examples. The set 500 includes leads 502, 504, 506, and 508. In examples, the leads in the set 500 are substantially thicker (e.g., 200 microns) than the leads of the leadframe 200. In examples, the leads of the set 500 are fewer in number than the leads of the leadframe 200. In examples, the leads in the set 500 comprise unplated copper.

Figure 5C:
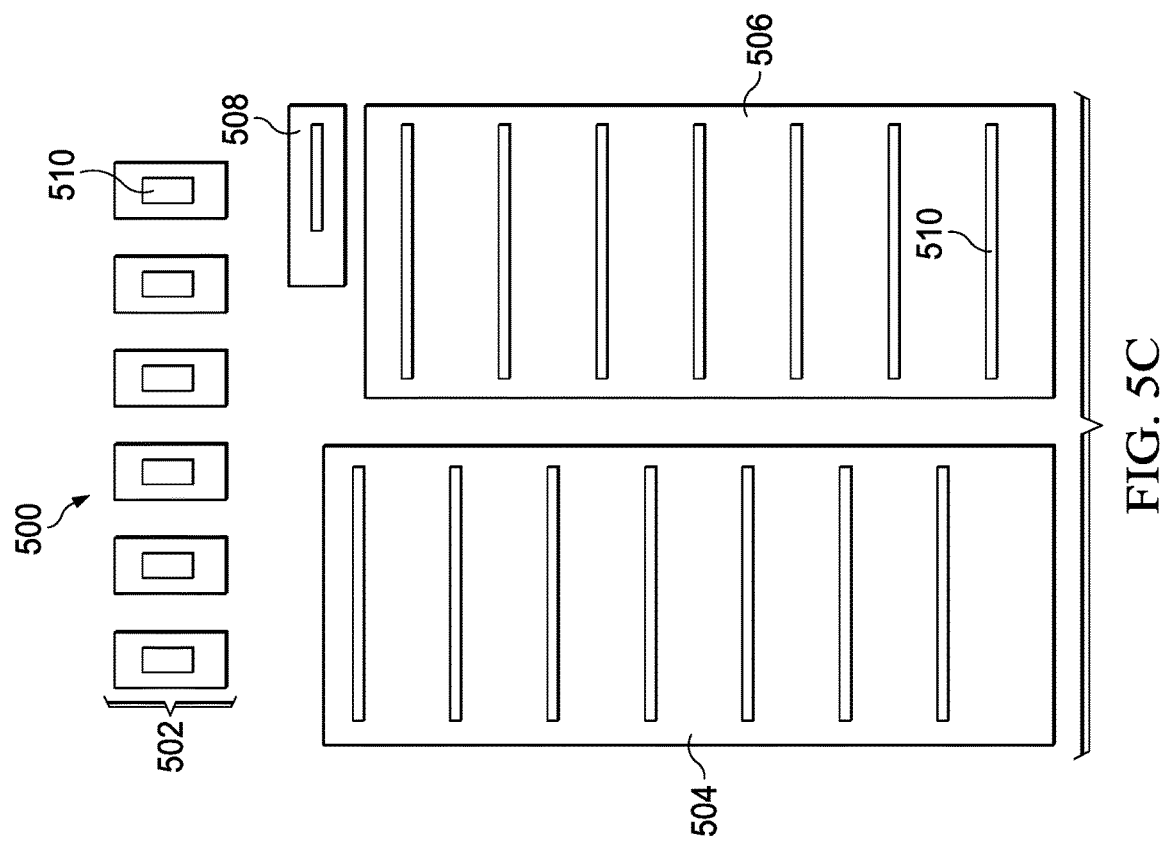
FIG. 5C depicts a frontal view of a set of leads having multiple plates, in accordance with various examples.
Figure 5B:
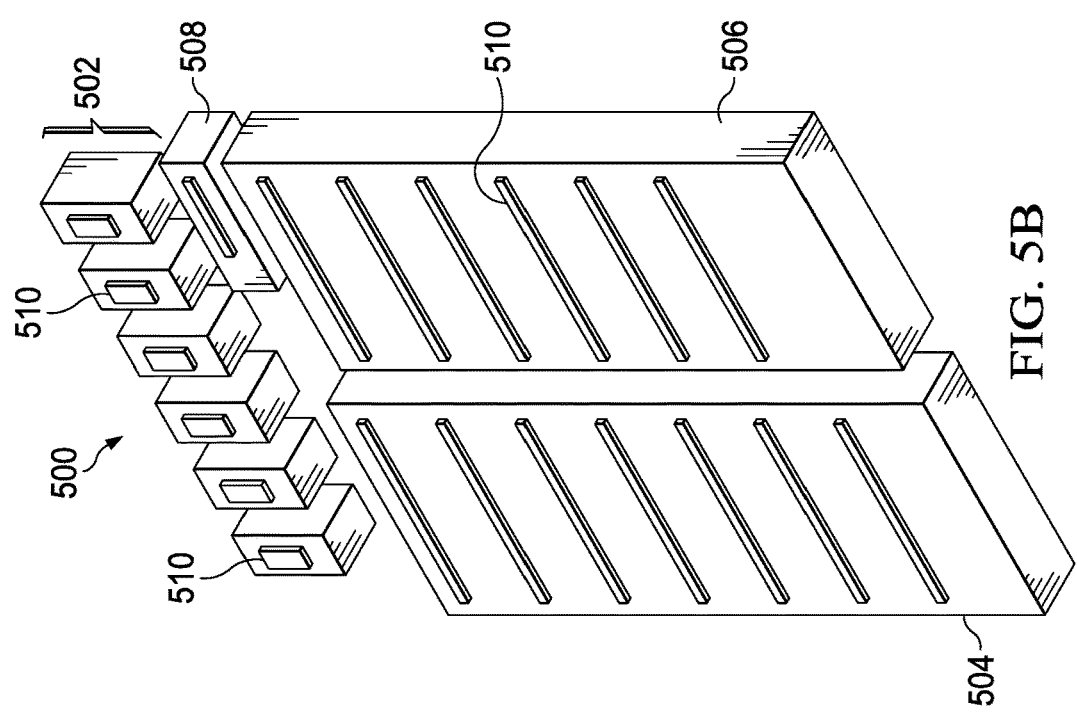
FIG. 5B depicts a perspective view of a set of leads having multiple plates, in accordance with various examples.

FIG. 5B depicts a perspective view of the leads in set 500, in accordance with examples. The leads depicted in FIG. 5B have conductive plating 510 applied to the leads, as shown. In examples, the plating 510 is applied to the leads 502 to facilitate the coupling of leads 502 to the leads 202 on the package 400. In examples, the plating 510 is applied to the lead 504 to facilitate coupling to the leads 210 on the package 400. In examples, the plating 510 is applied to the lead 506 to facilitate coupling to the leads 208 on the package 400. In examples, the plating 510 is applied to the lead 508 to facilitate coupling to the lead 204 on the package 400. To facilitate coupling of the lead 504 only to leads 210 and the coupling of the lead 506 only to the leads 208, the plating 510 is applied to the leads 504 and 506 in a staggered fashion, as shown. FIG. 5C depicts a frontal view of the set of leads 500. In examples, the plating 510—as may be true for other plating described herein—may be composed of nickel; nickel palladium; nickel palladium gold; nickel tungsten; tin; tin gold; gold; and silver.

Figure 6:
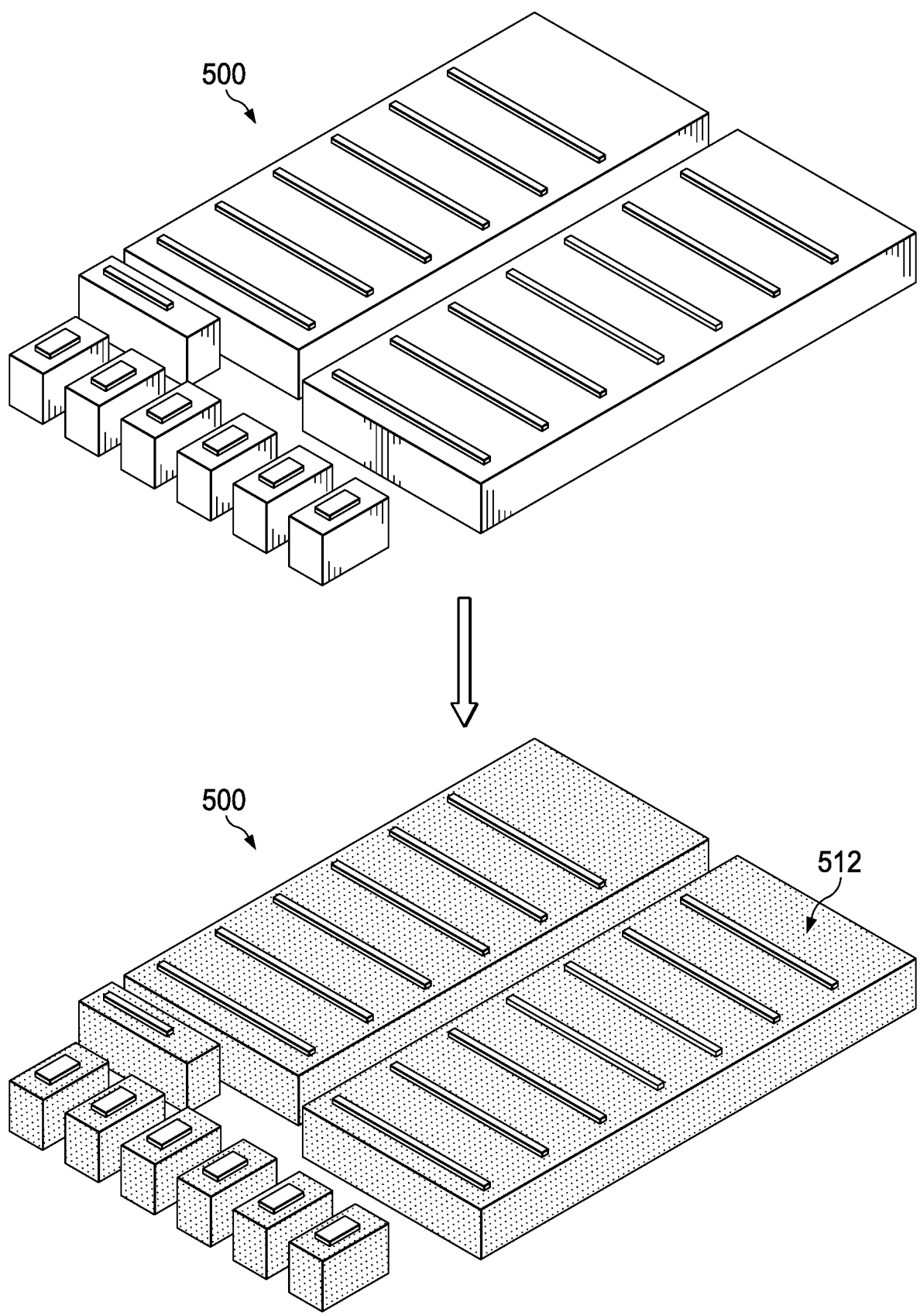
FIG. 6 depicts a first perspective view of a set of leads having multiple plates and a second perspective view of the set of leads having an insulating coat, in accordance with various examples.

FIG. 6 depicts a perspective view of the set of leads 500 undergoing a coating process. Specifically, the set of leads 500 is sprayed with or dipped in a mixture of mercaptopropyl trimethoxysilane (MPTS) with methanol or ethanol. This application of MPTS to the copper surfaces of the set of leads 500 results in the leads having a non-conductive coating 512. In examples, the coating 512 is copper sulfide, although the scope of disclosure is not limited to any particular coating technique or resulting coating composition. The MPTS does not react with the plating 510, and so no coating is applied to the plating 510. The coating 512 may be enhanced with a thermal cure (e.g., 50 to 60 degrees Celsius for 2-10 minutes). The enhanced coating 512 is able to better withstand chemical and thermal damage during later electroplating.

Figure 7A:
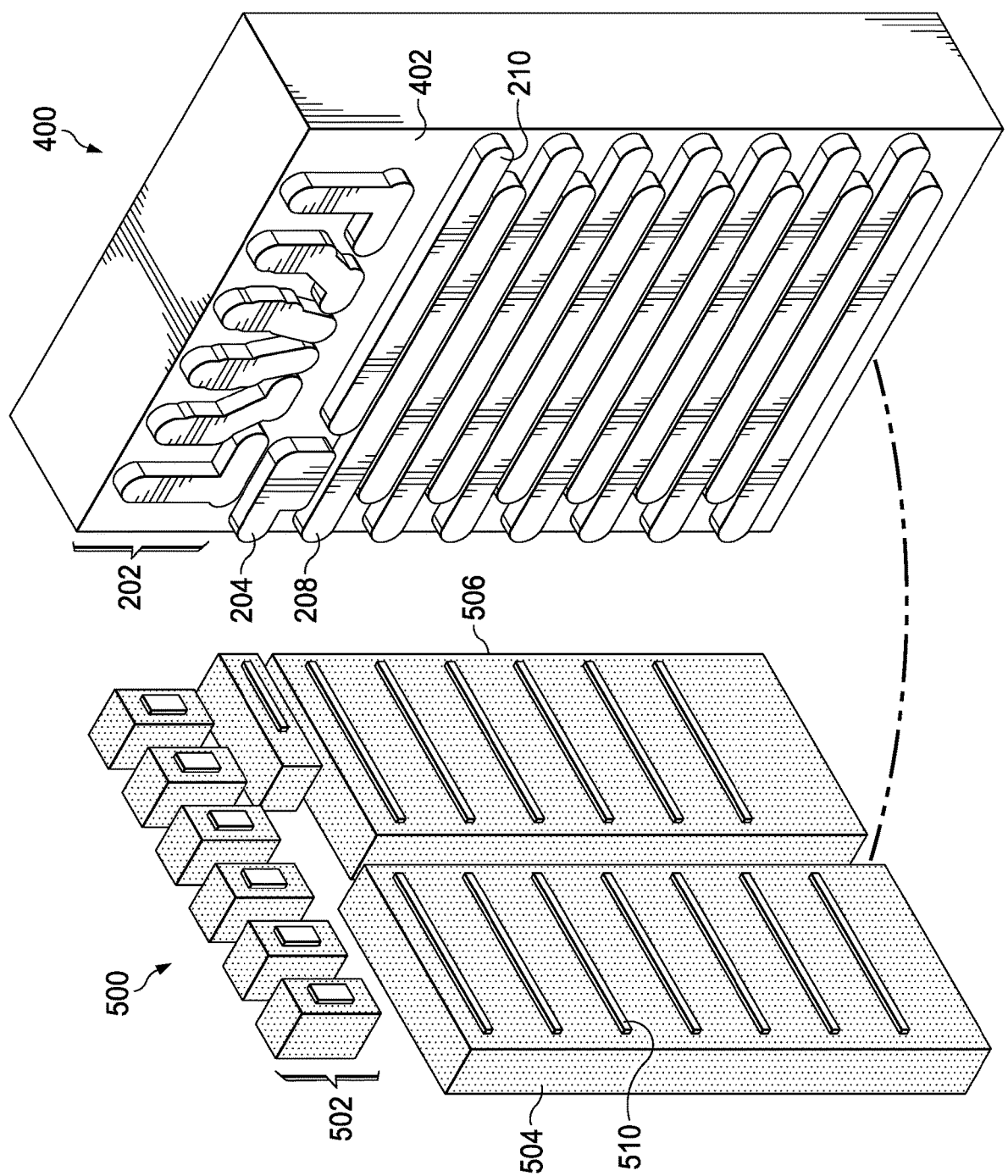
FIG. 7A depicts a perspective view of a set of leads having multiple plates and a package having multiple leads, in accordance with various examples.

FIG. 7A depicts a perspective view of the set of leads 500 (with coating) in the process of being coupled to the package 400. The leads 502 of the set 500 are aligned with, but do not yet couple to, the leads 202 of the package 400. The lead 504 is aligned with, but does not yet couple to, the leads 210. The lead 506 is aligned with, but does not yet couple to, the leads 208. The lead 508 is aligned with, but does not yet couple to, the lead 204.

Figure 7C:
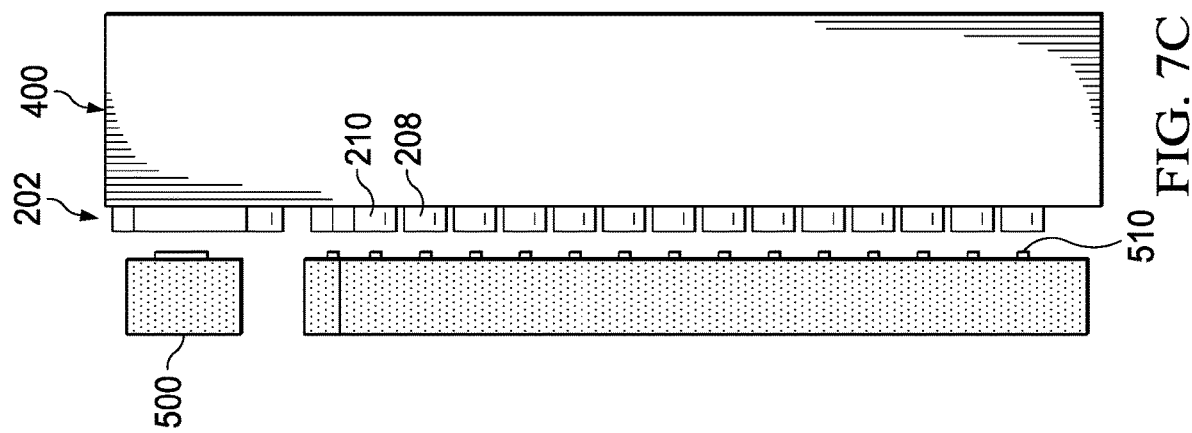
FIG. 7C depicts a side view of a set of leads having multiple plates and a package having multiple leads, in accordance with various examples.
Figure 7B:
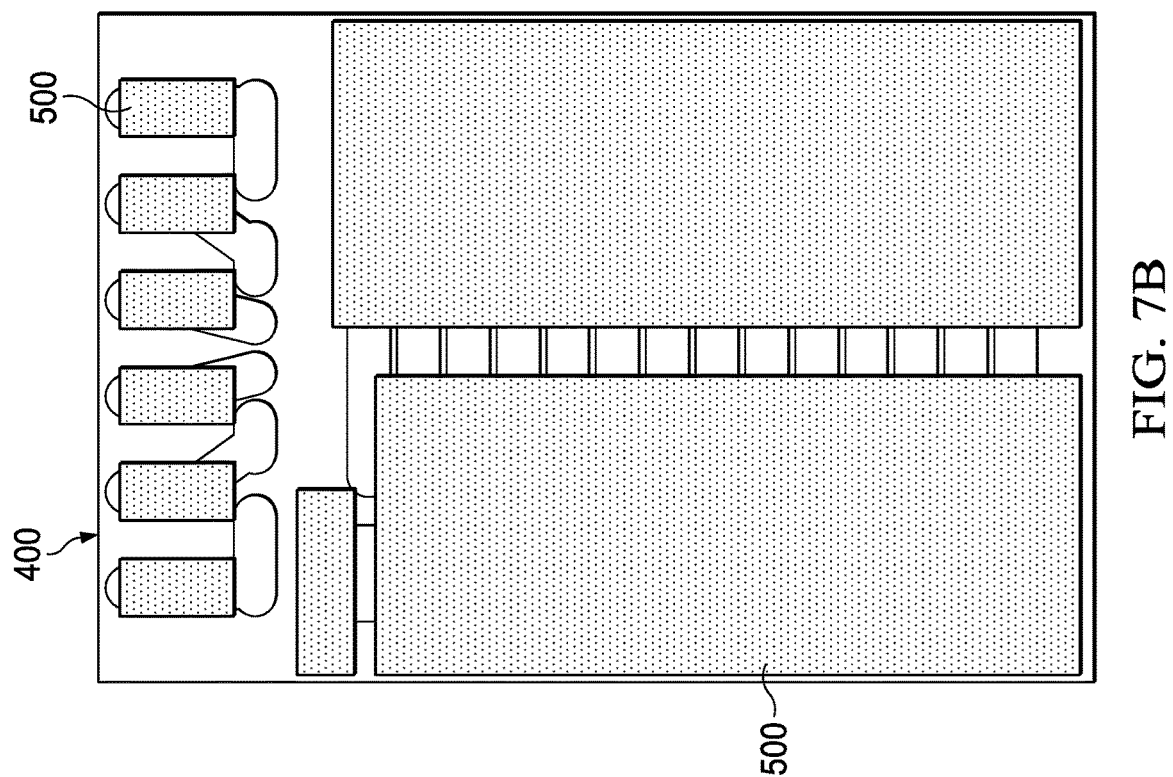
FIG. 7B depicts a frontal view of a set of leads having multiple plates and a package having multiple leads, in accordance with various examples.

FIG. 7B depicts a frontal view of the coupling process between the set of leads 500 and the package 400. In examples, at least some of the leads of the set 500 are positioned substantially orthogonal (e.g., within 10 degrees of orthogonal) to the leads of the leadframe 200. In examples, the lead 504 is sufficiently long so that it spans the full array of leads 208, 210. In examples, the lead 506 is sufficiently long so that it spans the full array of leads 208, 210. In examples, each of the leads in the set 500 has a greater surface area and volume than a corresponding lead depicted in FIG. 2.

FIG. 7C depicts a side view of the aforementioned coupling process. As shown, each instance of the plating 510 is aligned with, but does not yet couple to, a corresponding lead on the package 400. The distance between the plating 510 and the respective leads of the package 400, in some examples, is between 4 and 60 microns.

Figure 7E:
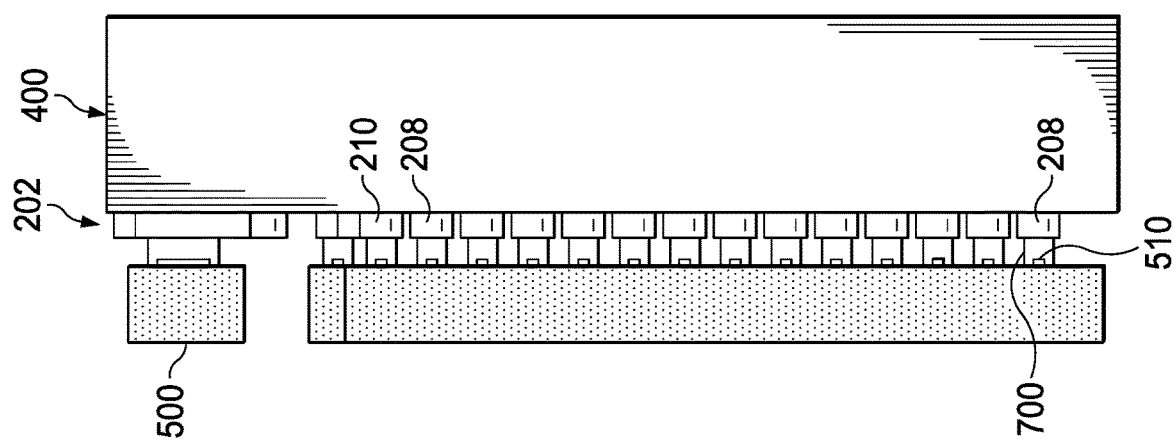
FIG. 7E depicts the electroplating of a set of leads having multiple plates, and a package having multiple leads, in accordance with various examples.
Figure 7D:
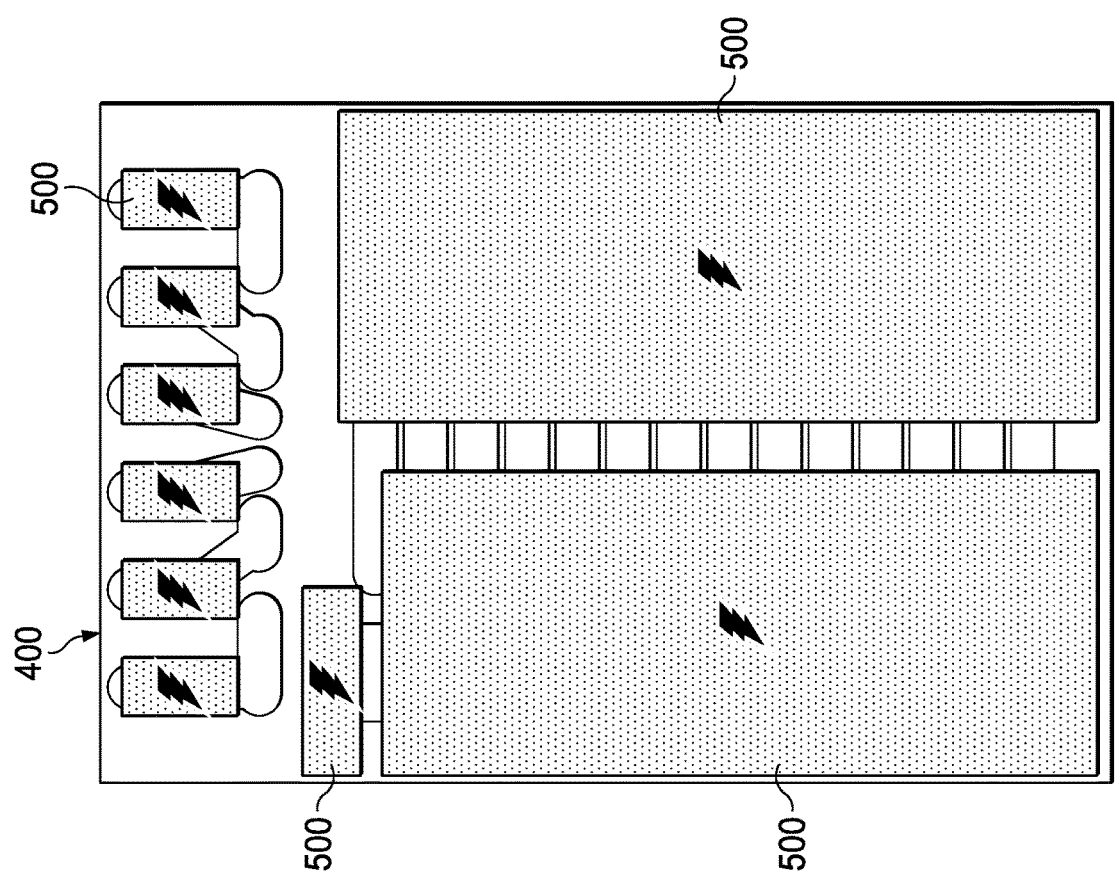
FIG. 7D depicts the electroplating of a set of leads having multiple plates, and a package having multiple leads, in accordance with various examples.

FIGS. 7D and 7E depict the process by which the spacing between the plating 510 and the respective leads of the package 400 is bridged. Specifically, in FIG. 7D, the set of leads 500 and the package 400 are placed in an electroplating bath, such as a copper or a nickel electroplating bath. Current is then applied to a lead of the set 500. Although not expressly depicted in the drawings, the leads in the set 500 form a common electrical pathway using, e.g., conductive dam bars. As FIG. 7E depicts, the current and the electroplating bath cause conductive plating 700 (e.g., copper plating) to form between the plating 510 and the corresponding leads on the package 400.

Figure 8B:
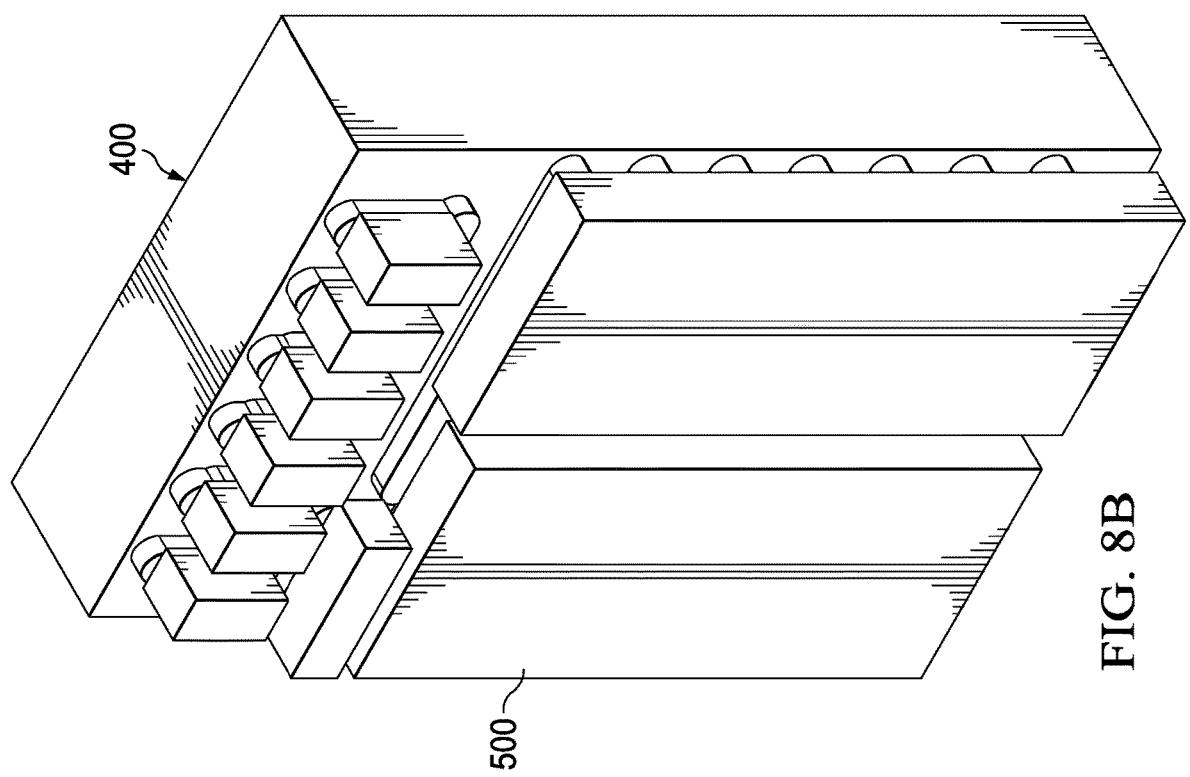
FIG. 8B depicts a perspective view of a set of leads having multiple plates coupled to multiple leads of a package, in accordance with various examples.
Figure 8A:
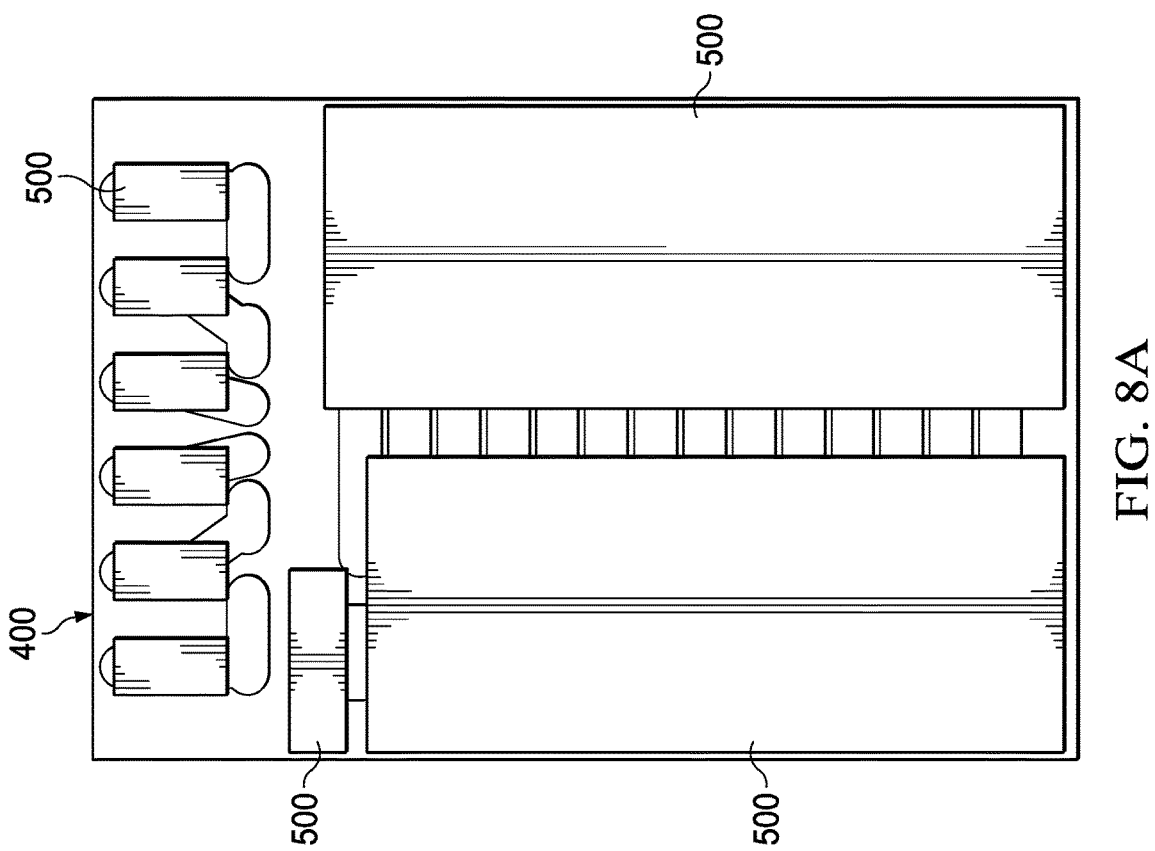
FIG. 8A depicts a frontal view of a set of leads having multiple plates coupled to multiple leads of a package, in accordance with various examples.
Figure 8C:
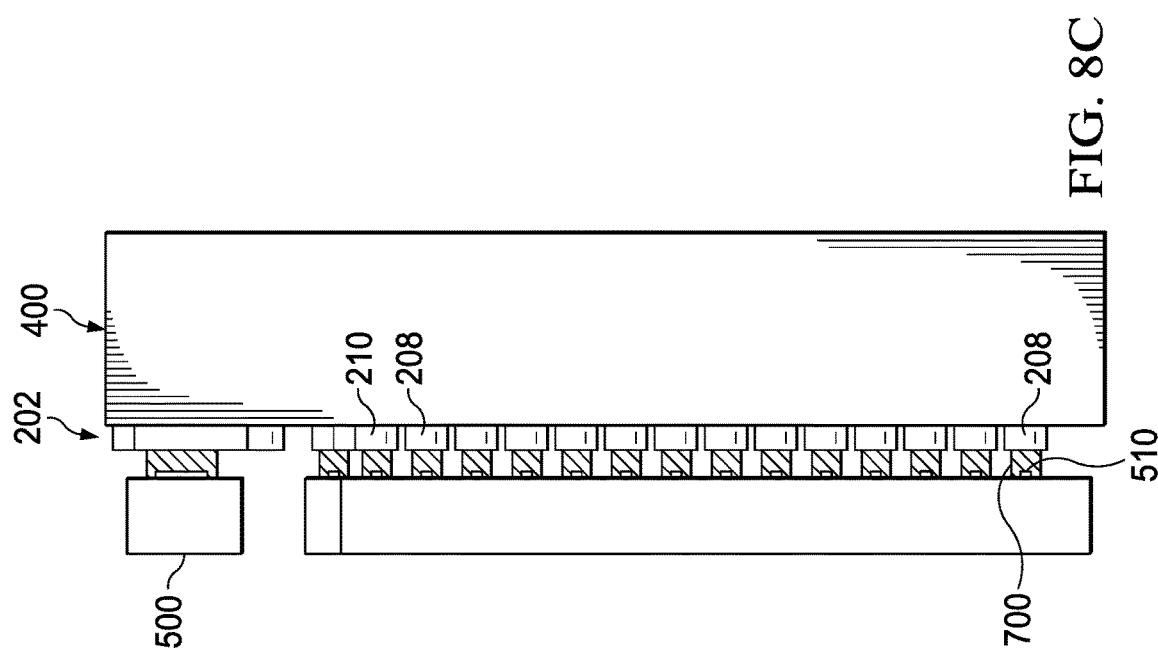
FIG. 8C depicts a side view of a set of leads having multiple plates coupled to multiple leads of a package, in accordance with various examples.

FIG. 8A depicts a frontal view of the assembly of FIG. 7E, but with the non-conductive coating 512 stripped away. The coating 412 may be stripped away using any suitable solvent, such as acetone or pyrolidone. FIG. 8B depicts a perspective view of the assembly of FIG. 8A. FIG. 8C depicts a side view of the assembly of FIG. 8A.

Figure 9A:
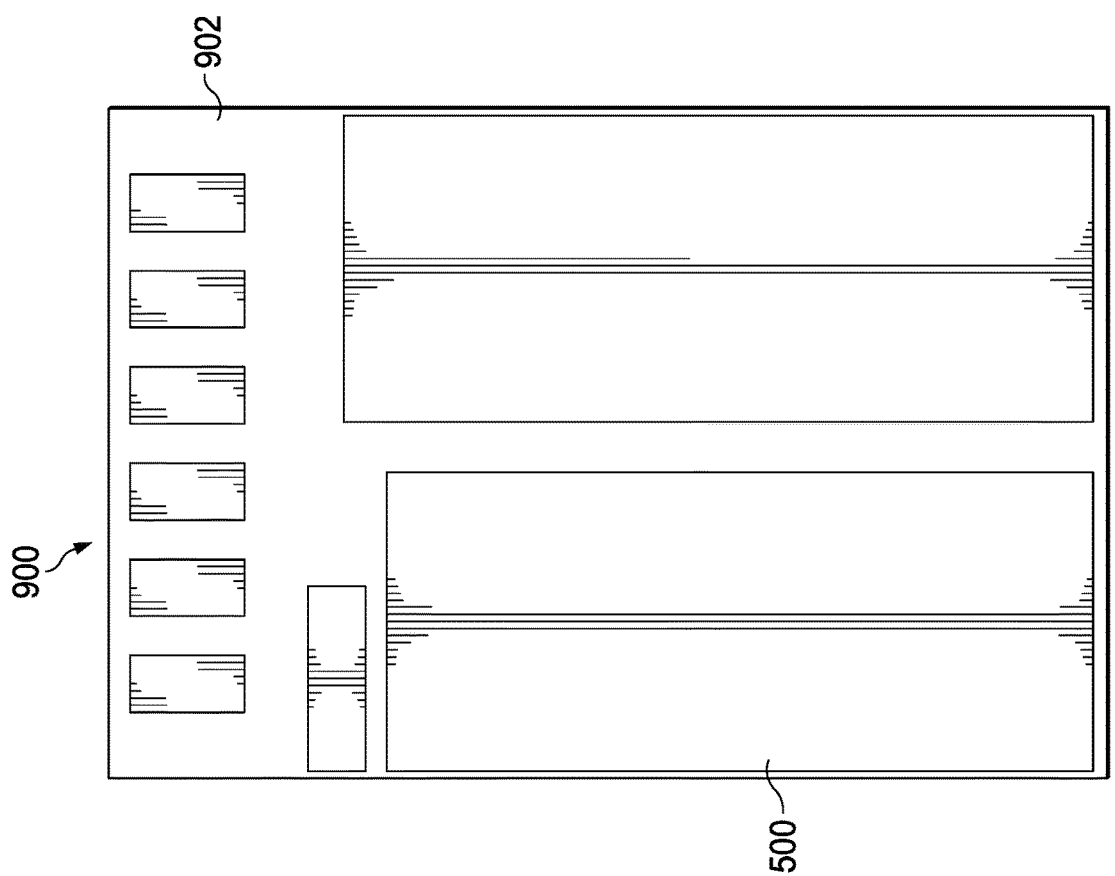
FIG. 9A depicts a frontal view of a package assembly having an exposed set of leads, in accordance with various examples.
Figure 9C:
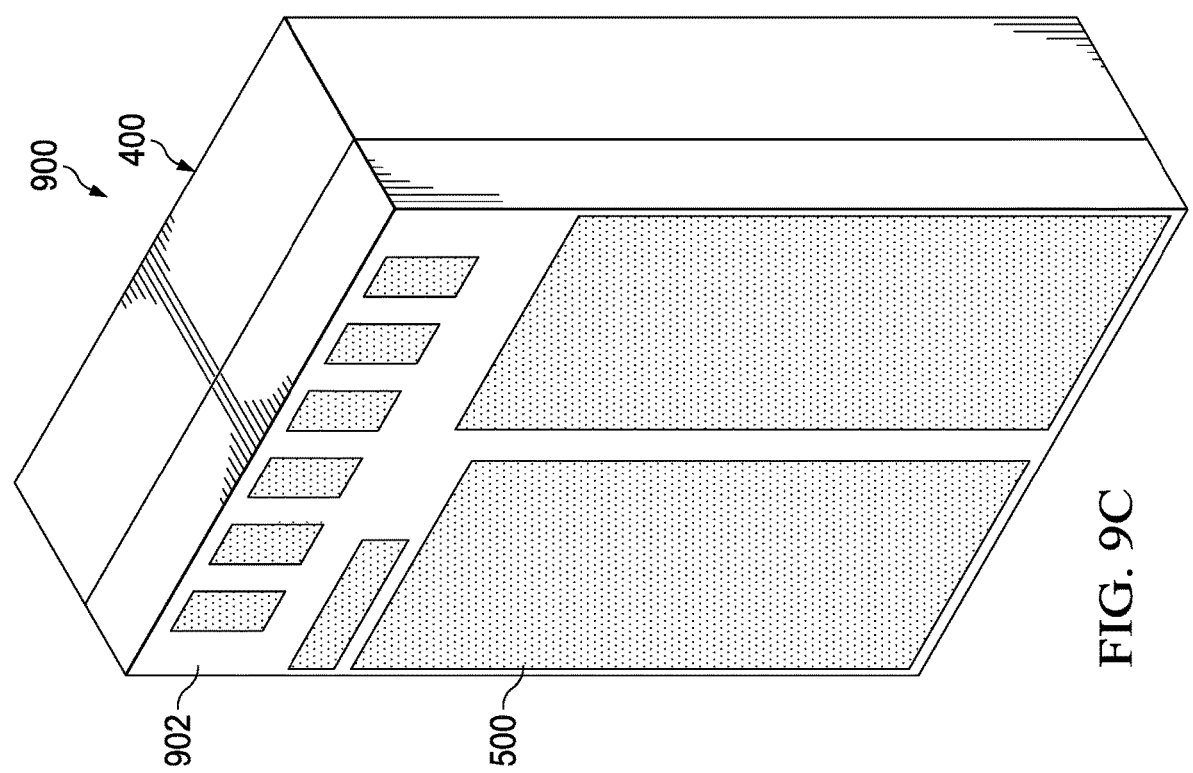
FIG. 9C depicts a perspective view of a package assembly having an exposed set of leads, in accordance with various examples.
Figure 9B:
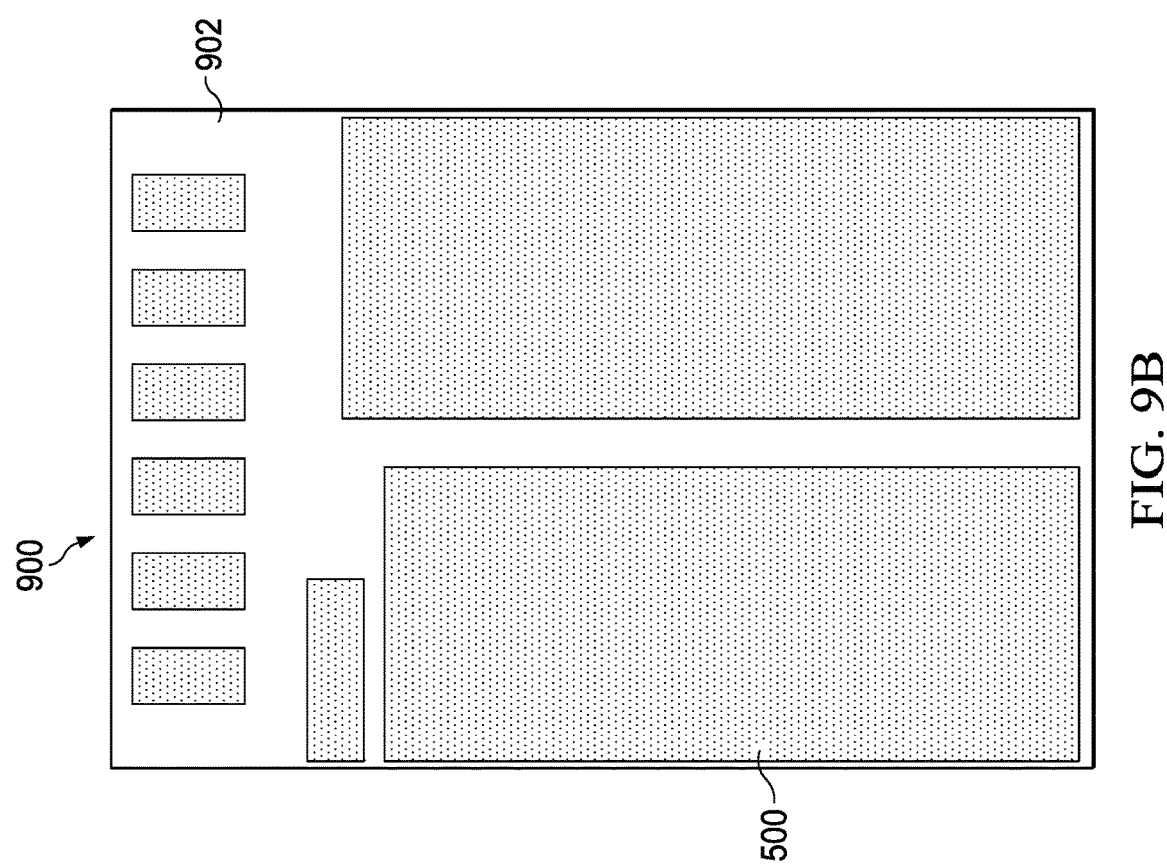
FIG. 9B depicts a frontal view of a package assembly having an exposed set of leads, in accordance with various examples.
Figure 9E:
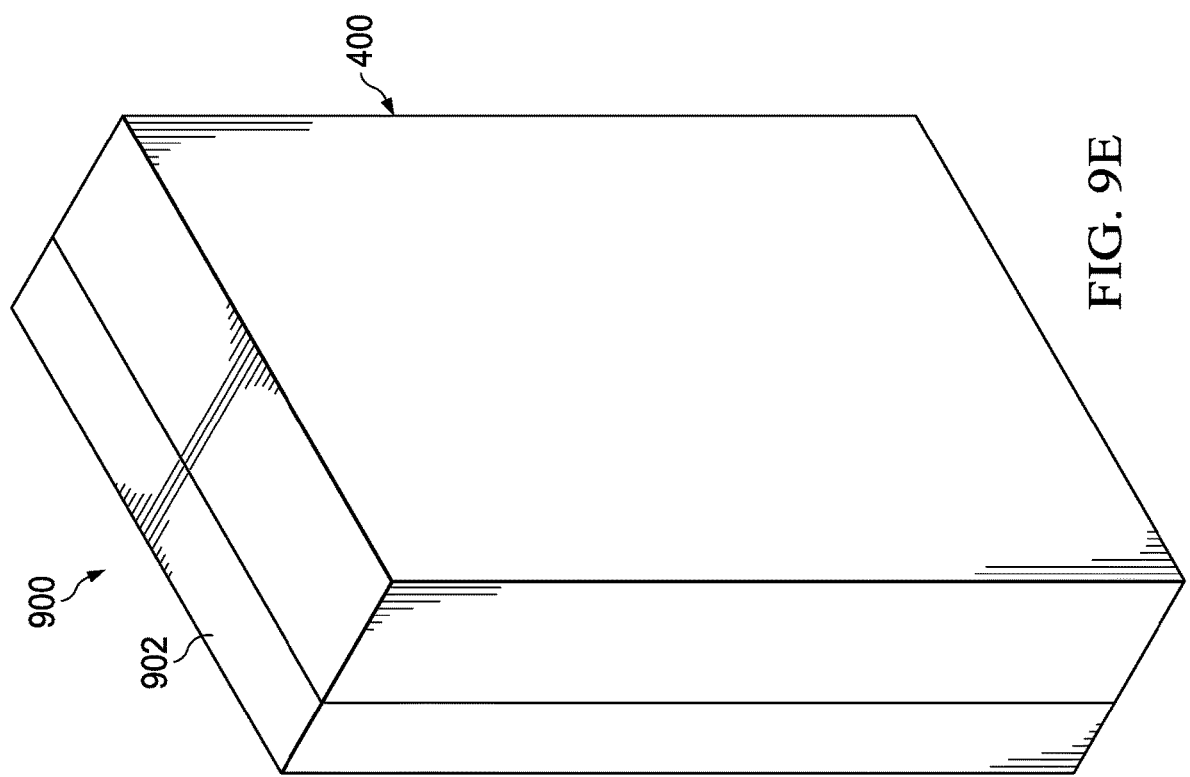
FIG. 9E depicts another perspective view of the package assembly of FIG. 9A, in accordance with various examples.
Figure 9D:
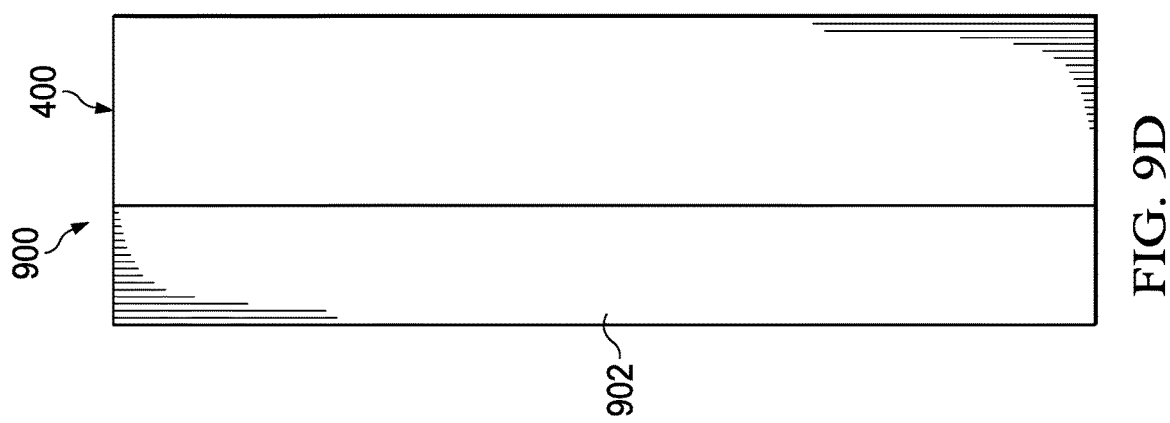
FIG. 9D depicts a side view of a package assembly having an exposed set of leads, in accordance with various examples.

FIG. 9A depicts a frontal view of a package assembly 900 comprising the package 400 (not expressly shown in FIG. 9A but depicted in FIGS. 9C and 9D) and molding (e.g., epoxy) 902 that encapsulates those components depicted in FIGS. 8A-8C that are not included within the package 400. As depicted, leads 500 are exposed to a surface of the molding 902. In examples, the leads 500 are uniformly flush with a surface of the molding 902. FIG. 9B depicts the package assembly 900 of FIG. 9A but with plating (e.g., using any suitable metal) applied to the leads 500. FIGS. 9C, 9D, and 9E provide front perspective, side, and rear perspective views, respectively, of the package assembly 900.

In addition to the technical advantages already described, the foregoing examples provide flexibility in coupling fine-pitched devices (e.g., die) to more coarsely-pitched devices (e.g., PCBs). More specifically, the finely-pitched leads, such as leads 208 and 210, electrically couple to the die 100.

The leads 208 and 210 couple to their respective coarsely-pitched leads 504 and 506, which in turn couple to devices that are well-suited to coarsely-pitched electrical connections, such as PCBs.

In many such examples, a package containing the die 100 and finely-pitched leads 208 and 210 may already have been manufactured and may be commercially available. In such cases, the leads 504 and 506 are coupled to the leads 208 and 210 as described above, and the completed assembly is then ready for coupling to a device such as a PCB. In some cases, however, it may be desirable to design and couple the finely-pitched and coarsely-pitched leadframes to each other prior to the addition of any molding. An example is now provided with regard to FIGS. 10A-11D.

Figure 10A:
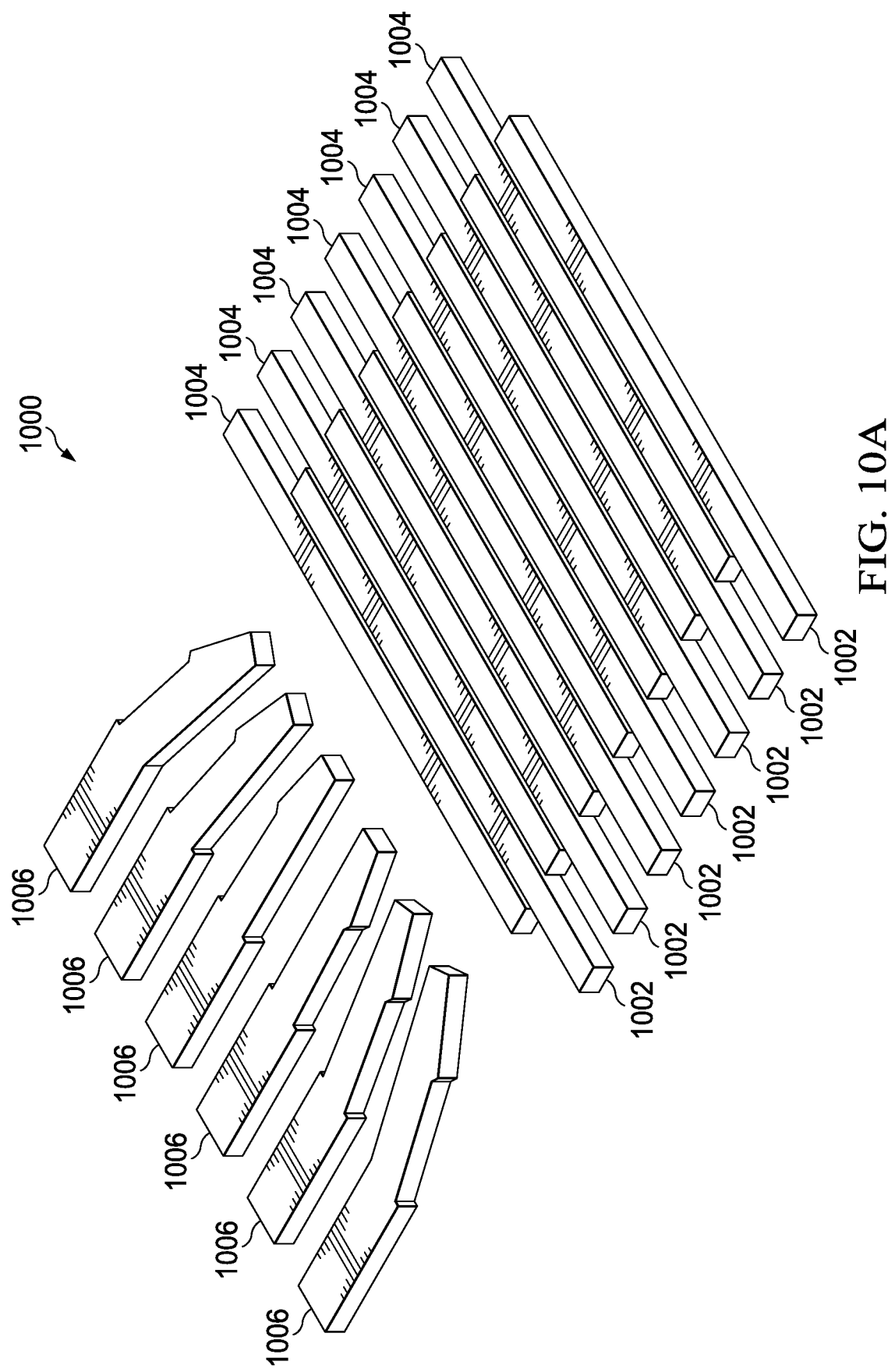
FIG. 10A depicts a perspective view of a set of leads of a leadframe, in accordance with various examples.

FIG. 10A depicts a perspective view of leads in a first set of leads 1000 of a leadframe, in accordance with various examples. (As is the case above, the dam bars and associated mechanical connections typically found in a leadframe are omitted in these drawings for clarity.) The set of leads 1000 includes leads 1002, 1004, and 1006. The leads in the set 1000 are finely-pitched (e.g., a pitch ranging between 10 microns and 200 microns). The specific configuration of the leads in the set 1000 depends on the configuration of electrical connections on the die to which the leads will couple and may vary. FIG. 10A et seq. assume lead configurations that are similar to the lead configurations described above. The leads 1002, 1004 are arranged in an alternating configuration, similar to the leads 208, 210 described above. The leads 1006 may be arranged in a fan-out configuration to accommodate electrical connection spacing requirements of a PCB to which the leads 1006 will couple. In examples, each of the leads 1002, 1004 has a width of approximately 50 microns and a length of approximately 2 millimeters. In examples, the leads 1002, 1004, and 1006 are formed using a chemical etching, laser cutting, plasma cutting, or other suitable process with a thin (e.g., 10 micrometers to 100 micrometers) foil, such as a copper foil.

Figure 10B:
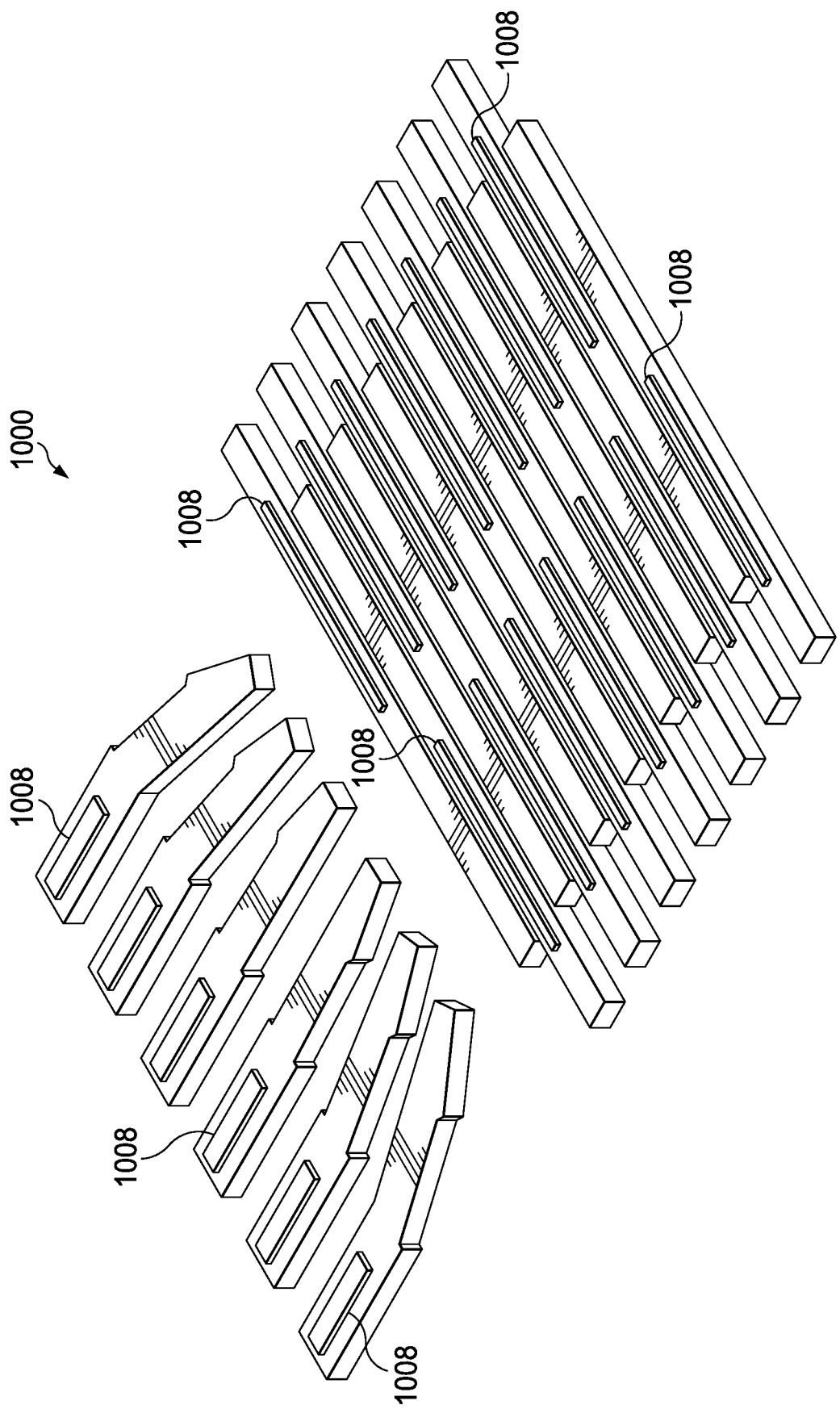
FIG. 10B depicts a perspective view of metal plates on a set of leads of a leadframe, in accordance with various examples.

FIG. 10B depicts a perspective view of metal plates 1008 on the leads of the set of leads 1000, in accordance with various examples. The plates 1008 may comprise any suitable conductive material besides copper and solder, such as nickel, nickel palladium, nickel palladium gold, stannum, nickel tungsten, etc. Copper is avoided to selectively differentiate from the base metal of the lead frame (since it may be desirable to later chemically coat the remainder of the lead frame and leave the contact areas uncoated), and solder is avoided to prevent the solder-associated challenges described in detail above.

Figure 10C:
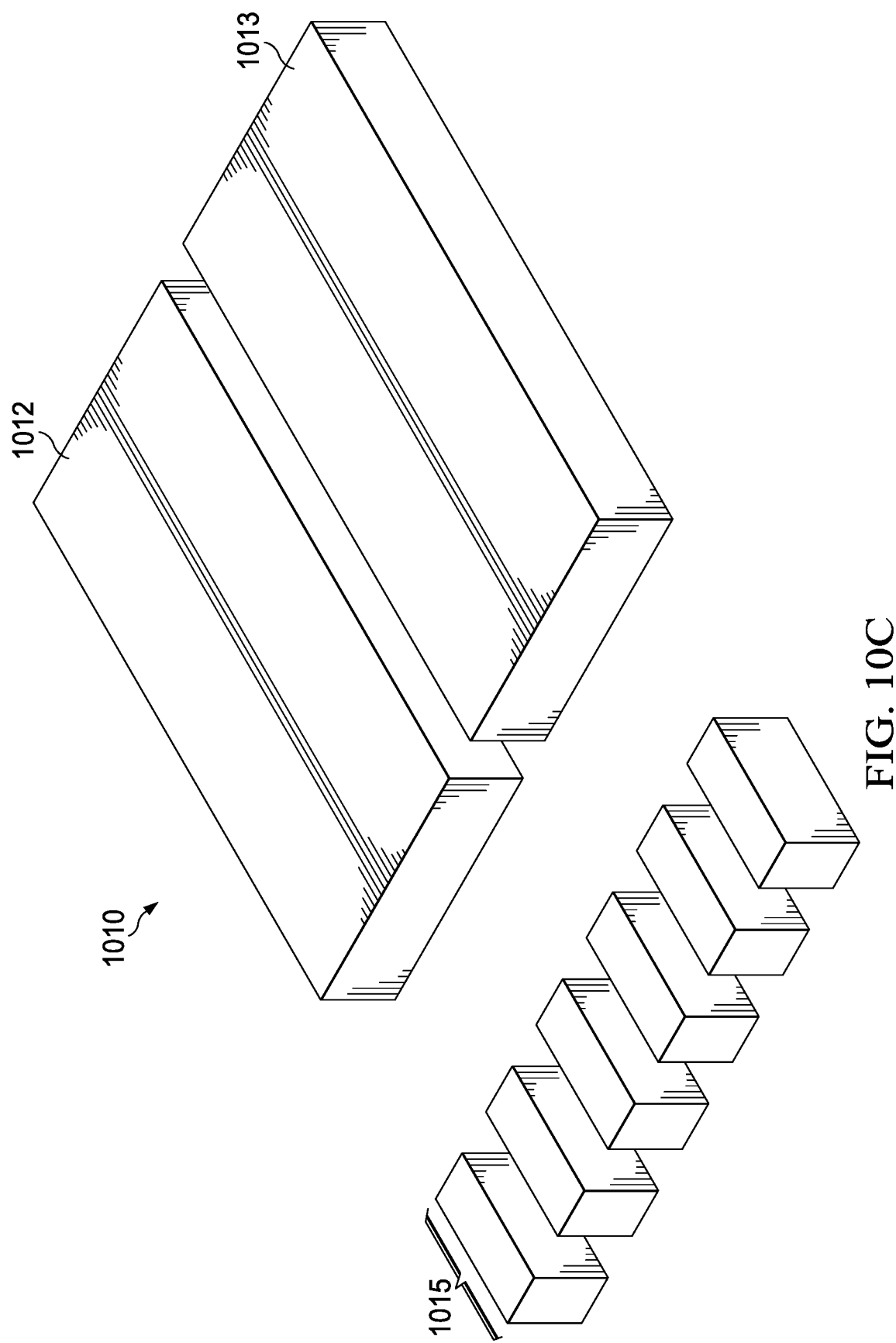
FIG. 10C depicts a perspective view of a set of leads in a leadframe, in accordance with various examples.

FIG. 10C depicts a perspective view of a set of leads 1010, in accordance with various examples. The set 1010 includes leads 1012, 1013, and 1015. Each of the leads 1012, 1013 is thicker than each of the leads 1002, 1004. Similarly, each of the leads 1015 is thicker than each of the leads 1006. In examples, the thickness of the leads 1012, 1013, 1015 is between 50 micrometers to 250 micrometers. In examples, the leads 1012, 1013, 1015 are created from a copper foil using chemical etching, laser cutting, plasma cutting, mechanical punching, or any other suitable processes. In examples, each of the leads 1012, 1013 has a length of approximately 3 millimeters and a width of approximately 2 millimeters. In examples, each of the leads 1015 has a length of approximately 0.45 millimeters and a width of approximately 0.3 millimeters.

Figure 10D:
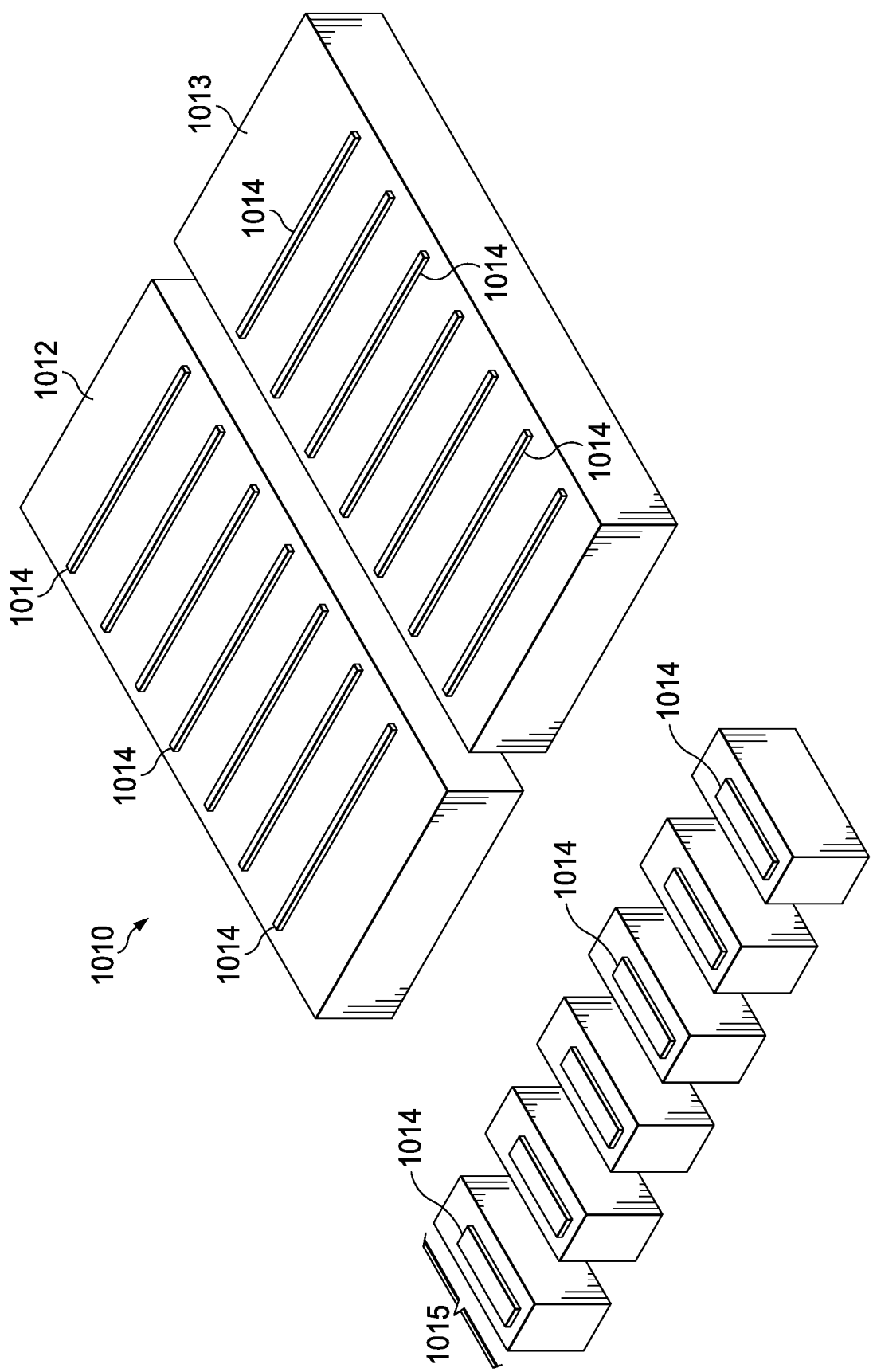
FIG. 10D depicts a perspective view of metal plates on a set of leads in a leadframe, in accordance with various examples.

FIG. 10D depicts a perspective view of metal plating 1014 deposited on the leads 1012, 1013, 1015, in accordance with various examples. The metal plating material may comprise any non-copper and non-solder material, such as nickel, nickel palladium, nickel palladium gold, stannum, nickel tungsten, etc. In examples, the metal plating 1014 is deposited in a configuration such that when the leads 1012, 1013, 1015 are mated with the leads 1002, 1004, 1006, respectively, the metal plating 1014 is aligned with the metal plating 1008.

Figure 10E:
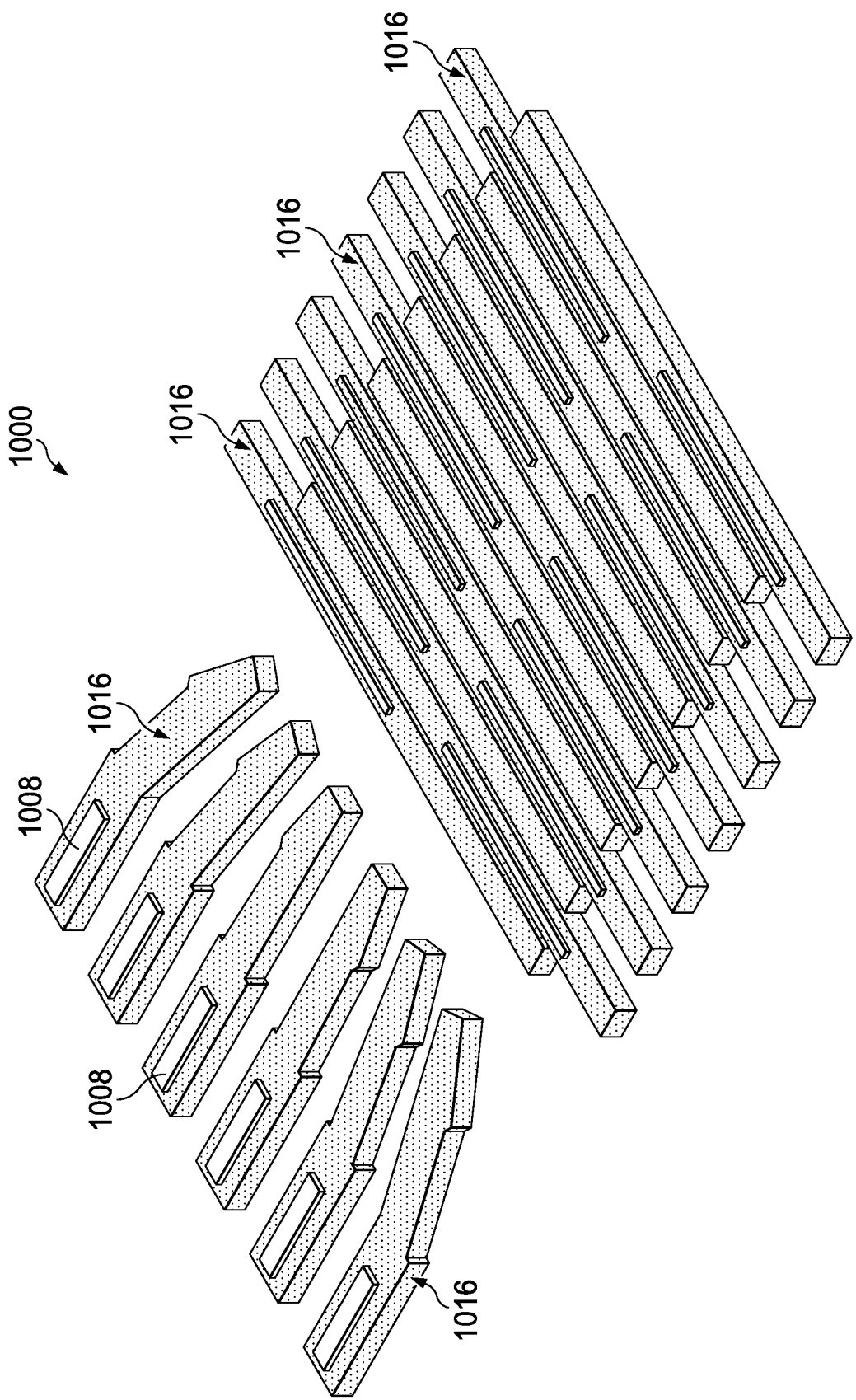
FIG. 10E depicts a perspective view of metal plates on a set of leads of a leadframe with the leads having an insulative coating, in accordance with various examples.
Figure 10F:
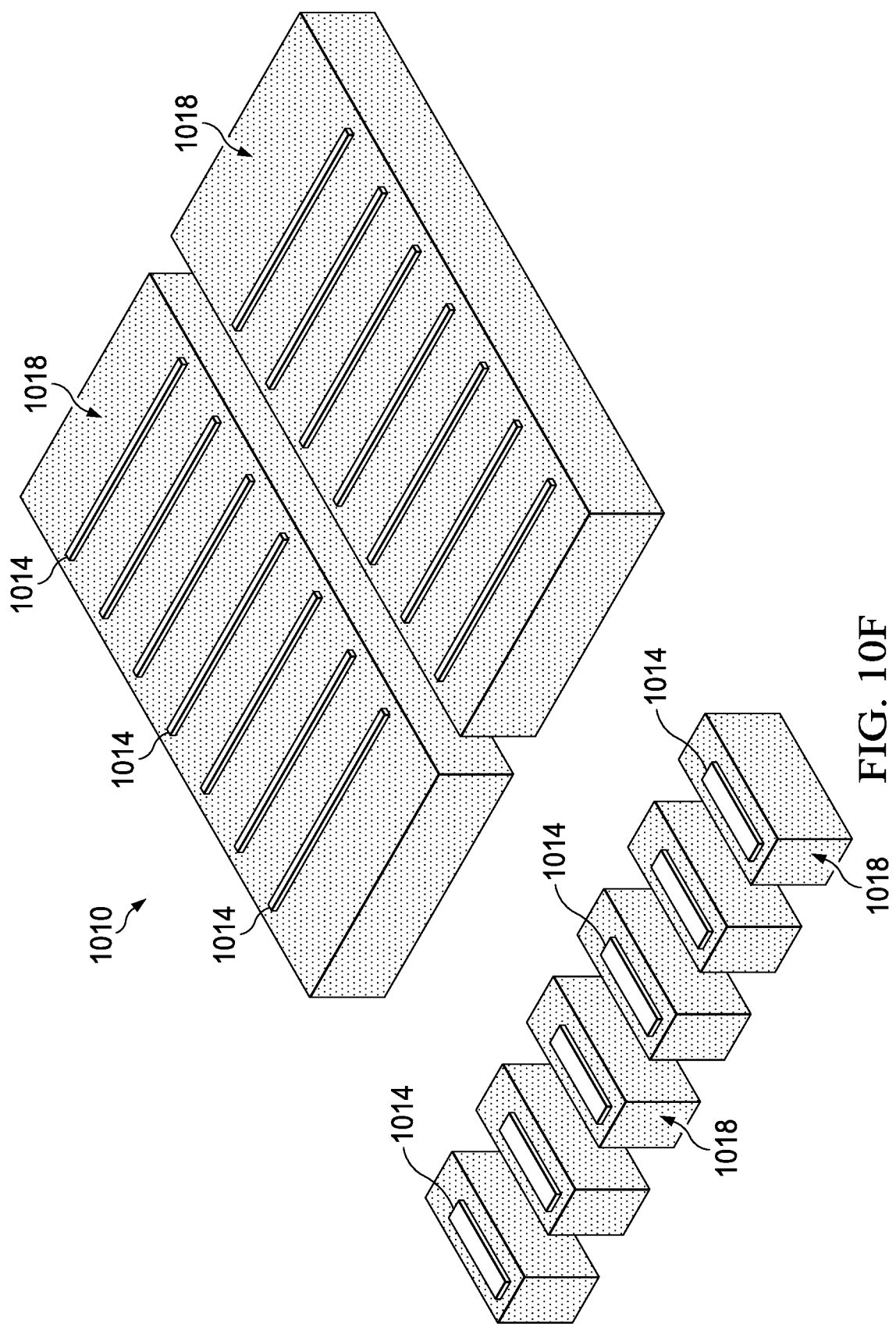
FIG. 10F depicts a perspective view of metal plates on leads in a set of leads of a leadframe with the leads having an insulative coating, in accordance with various examples.

FIGS. 10E and 10F depict perspective views of the sets of leads 1000 and 1010, respectively. The sets of leads 1000 and 1010 are coated with MPTS using a dipping or spraying technique. The MPTS reacts with and coats copper surfaces, but because the metal plating does not comprise copper, the metal plates are not coated with MPTS. In the set of leads 1000, the numeral 1016 indicates MPTS-coated areas. In the set of leads 1010, the numeral 1018 indicates MPTS-coated areas. In examples, the MPTS may be cured, for example, at 50 to 60 degrees Celsius for two to ten minutes. The cured coating is better able to withstand chemical and thermal impacts during subsequent electroplating, which is described below.

Figure 10G:
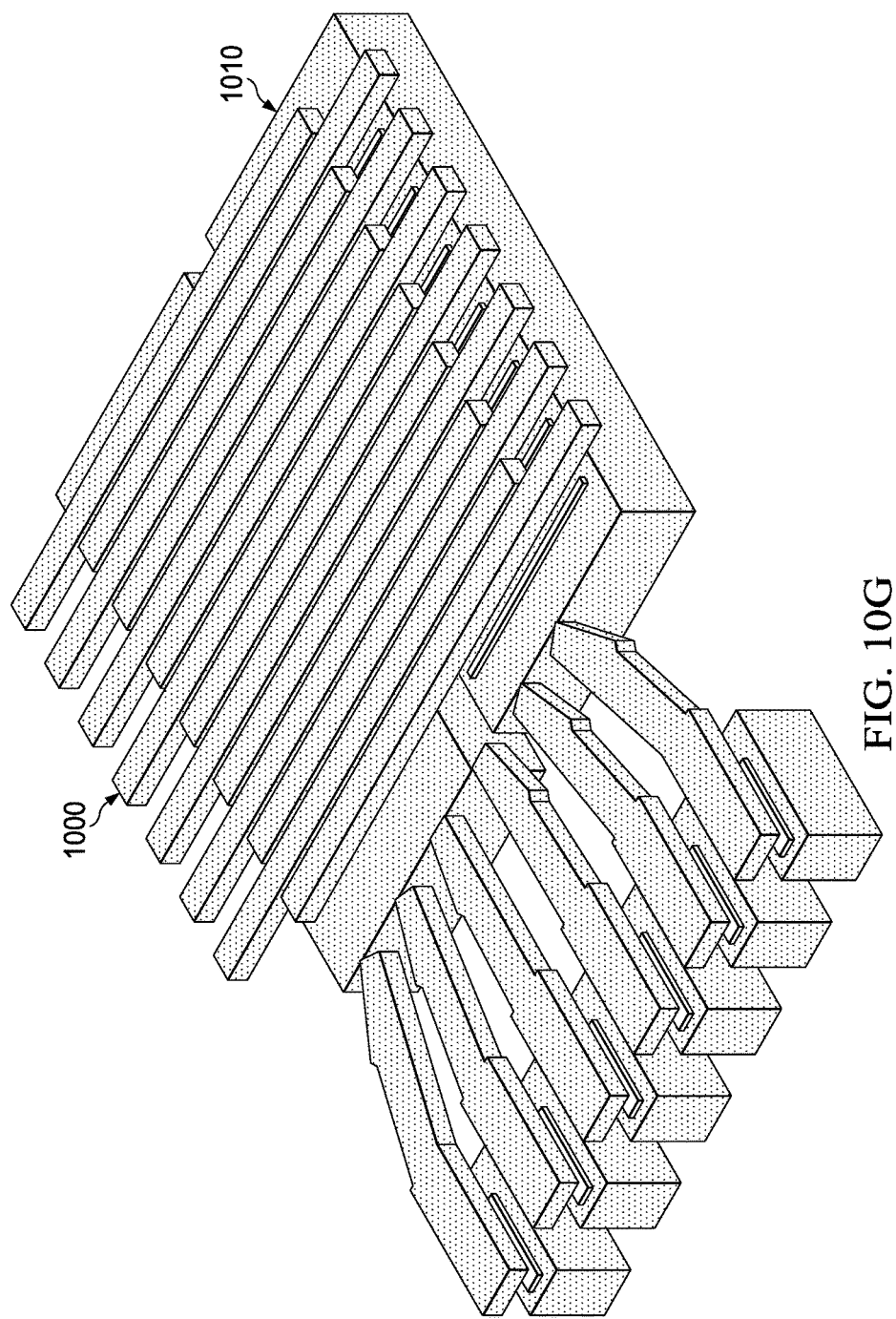
FIG. 10G depicts a perspective view of a set of leads of a leadframe aligned with a set of leads of another leadframe, the sets of leads having an insulative coating, in accordance with various examples.
Figure 10J:
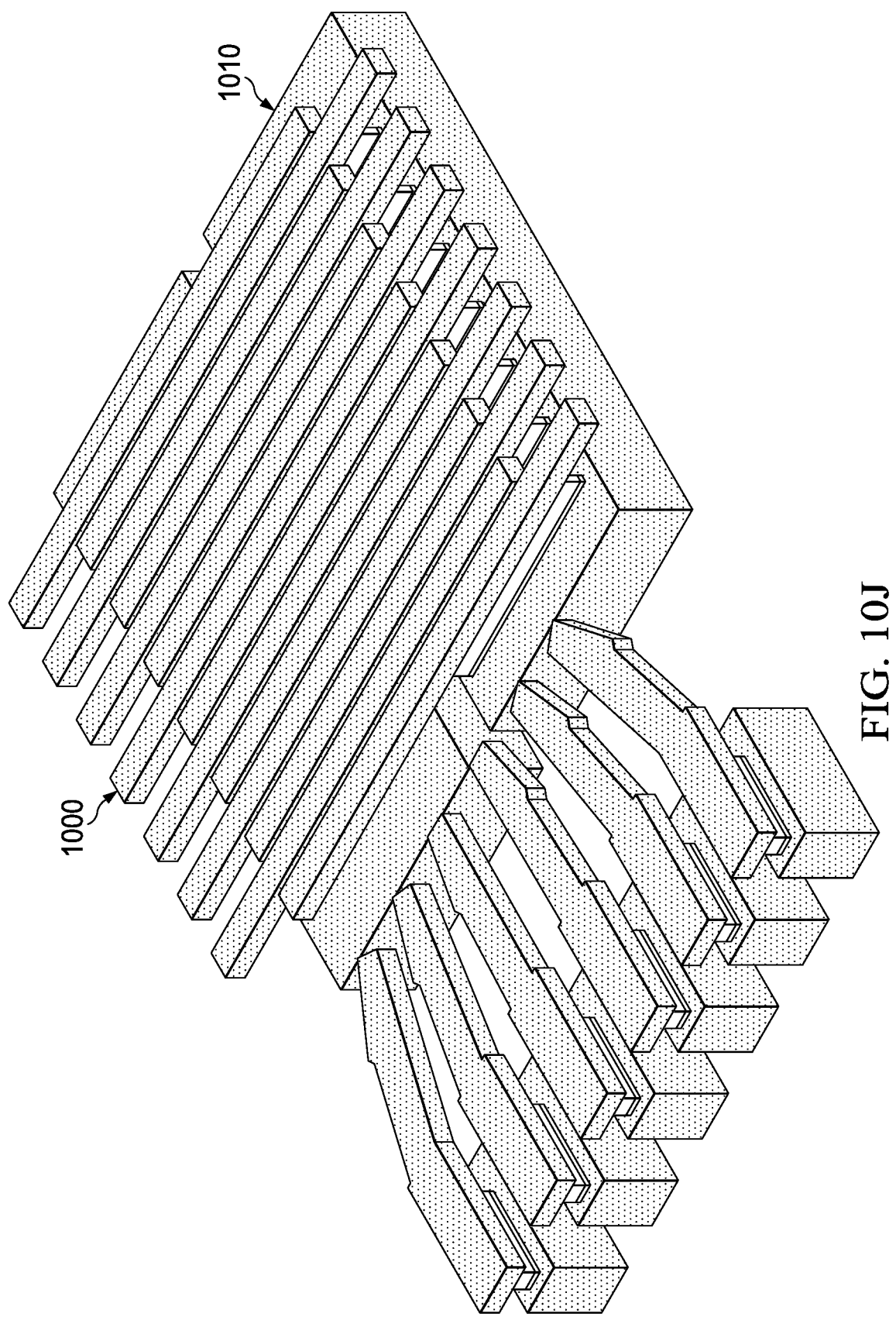
FIG. 10J depicts a perspective view of a set of leads of a leadframe coupled to a set of leads of another leadframe, the sets of leads having an insulative coating, in accordance with various examples.
Figure 10K:
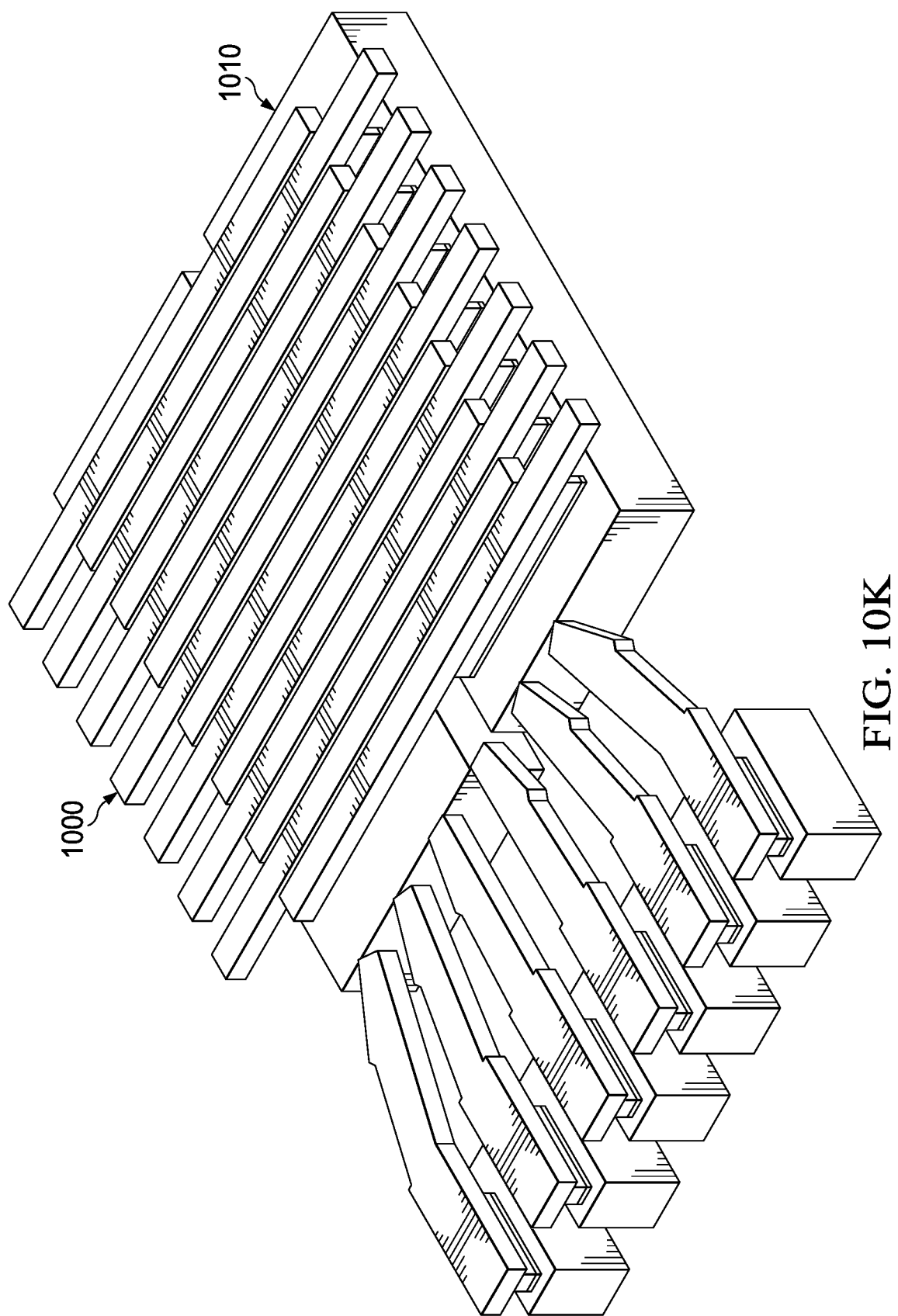
FIG. 10K depicts a perspective view of a set of leads of a leadframe coupled to a set of leads of another leadframe, in accordance with various examples.

FIG. 10G depicts a perspective view of the sets of leads 1000 and 1010 aligned with each other, and FIG. 10H depicts a side view of the same. The sets of leads 1000 and 1010 are aligned such that the metal plating on the leads of each set are aligned with each other, as depicted in FIG. 10H. In FIGS. 10G and 10H, the metal plates do not make contact with each other, but are instead held in alignment and close proximity (e.g., a distance of 15 microns between the metal plates) using spacers and clamps or other suitable equipment. The sets of leads 1000 and 1010 are then placed inside an electroplating bath and current is applied. FIG. 10I depicts a side view of the sets of leads 1000 and 1010 as the electroplating process causes plating 1020 to grow between the metal plating 1008 and 1014, thus bridging the gap between the metal plating 1008 and 1014. FIG. 10J depicts a perspective view of the assembly shown in FIG. 10I. The MPTS coating may be stripped away using a solvent (e.g., acetone or pyrolidone), as shown in the perspective view of FIG. 10K.

Figure 11A:
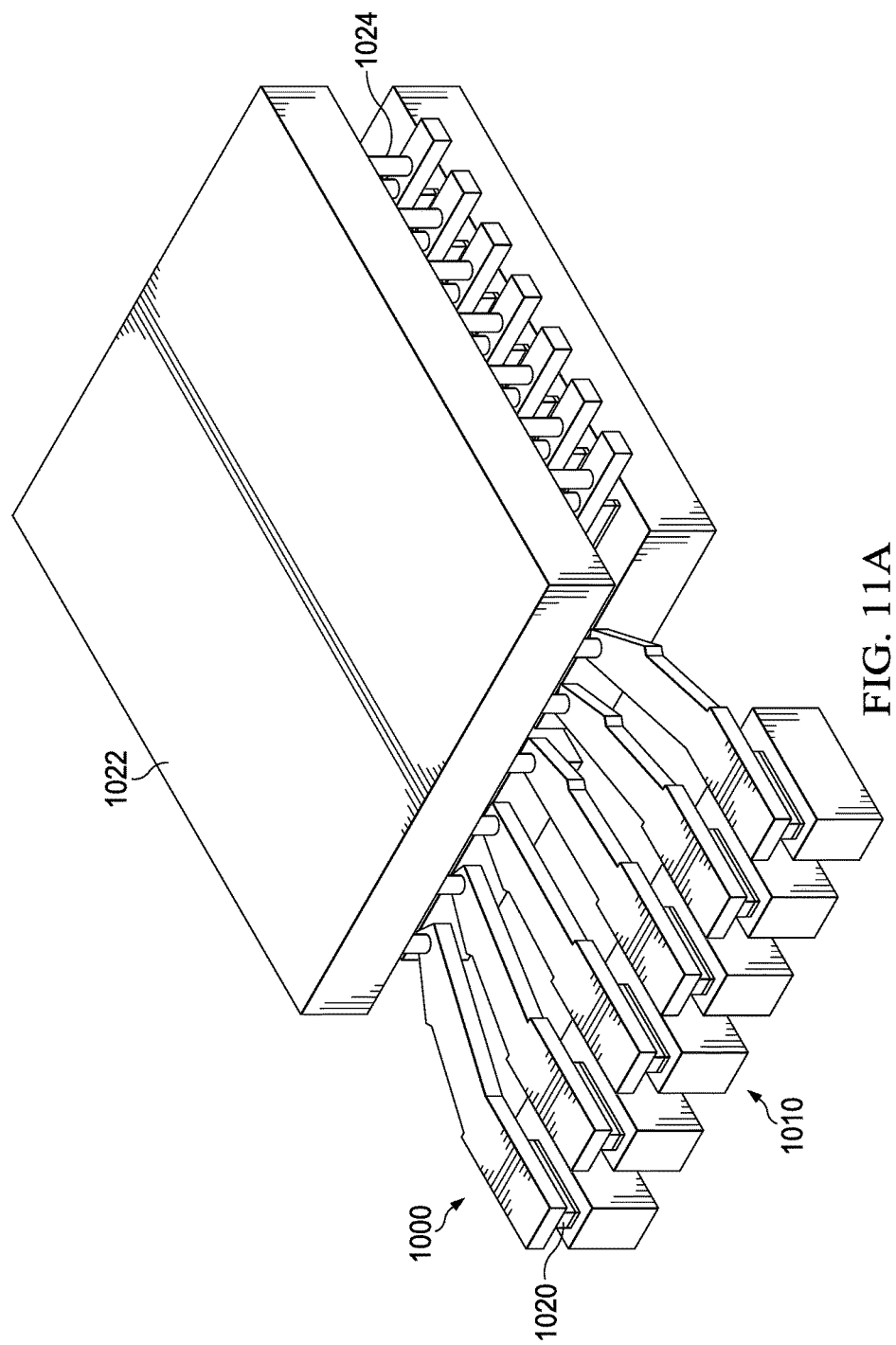
FIG. 11A depicts a perspective view of a die, a first set of leads of a leadframe, and a second set of leads of another leadframe, in accordance with various examples.
Figure 11B:
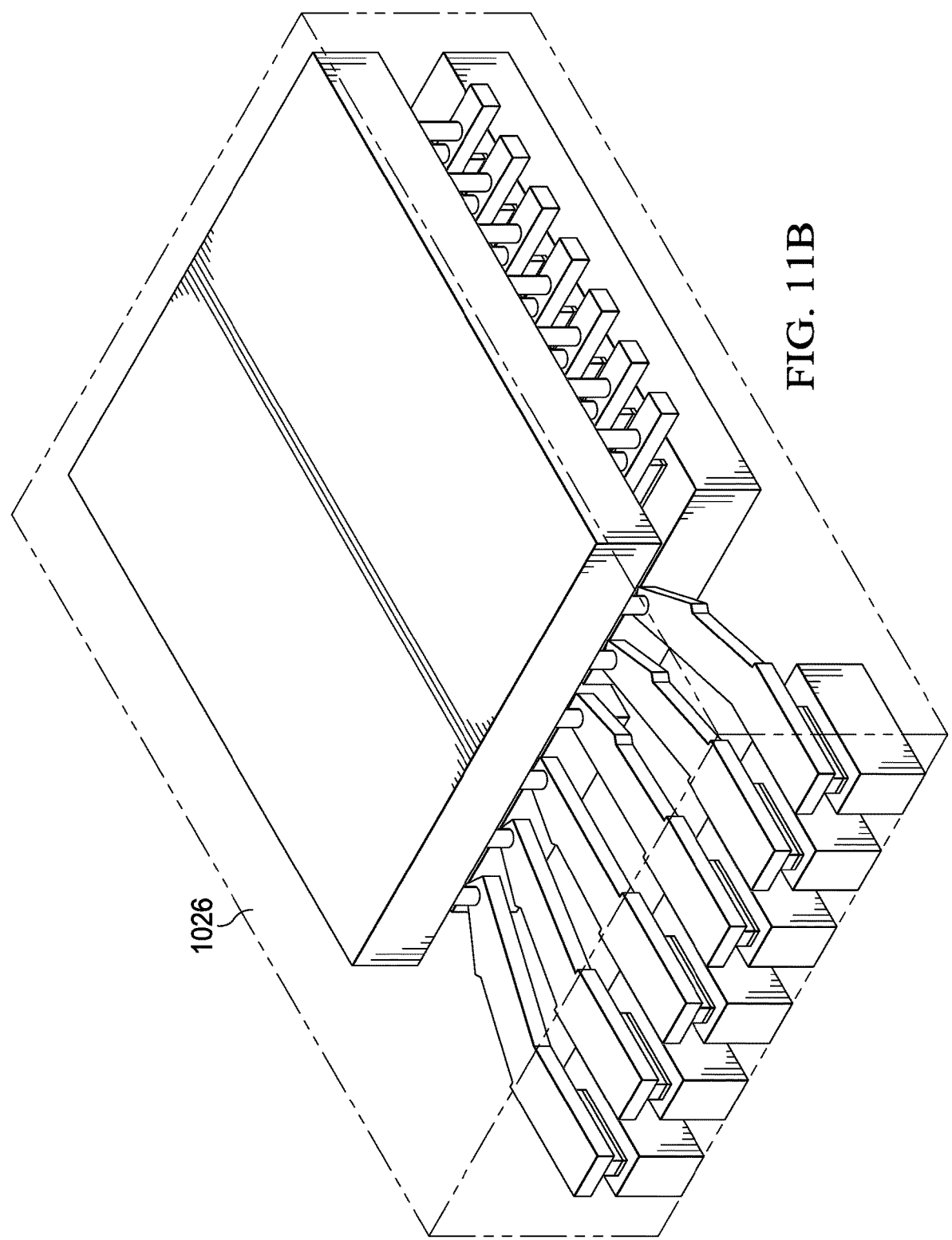
FIG. 11B depicts a perspective view of a package housing a die coupled to a first set of leads of a leadframe and to a second set of leads of another leadframe, in accordance with various examples.
Figure 11C:
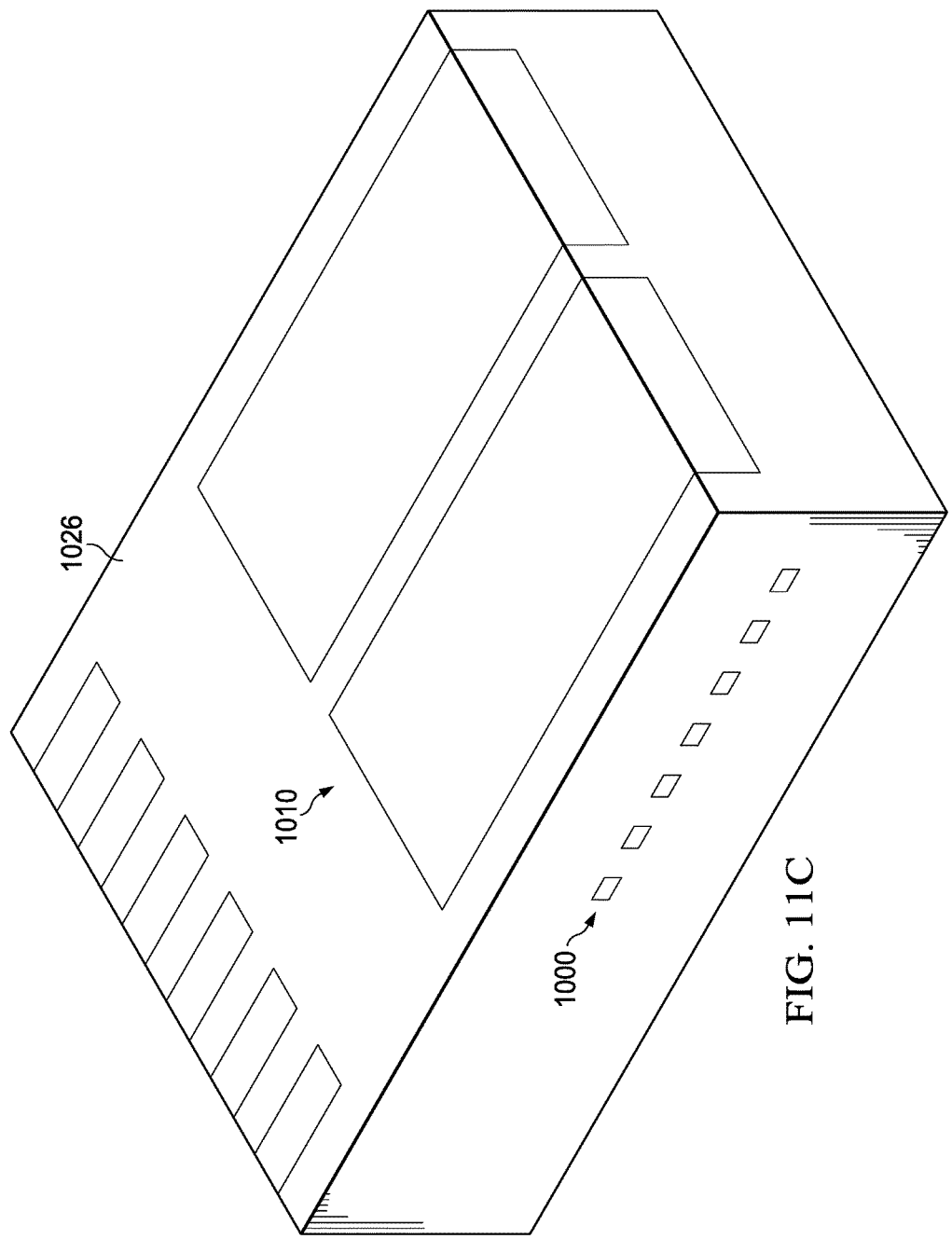
FIG. 11C depicts a perspective view of a package having multiple exposed leads, in accordance with various examples.
Figure 11D:
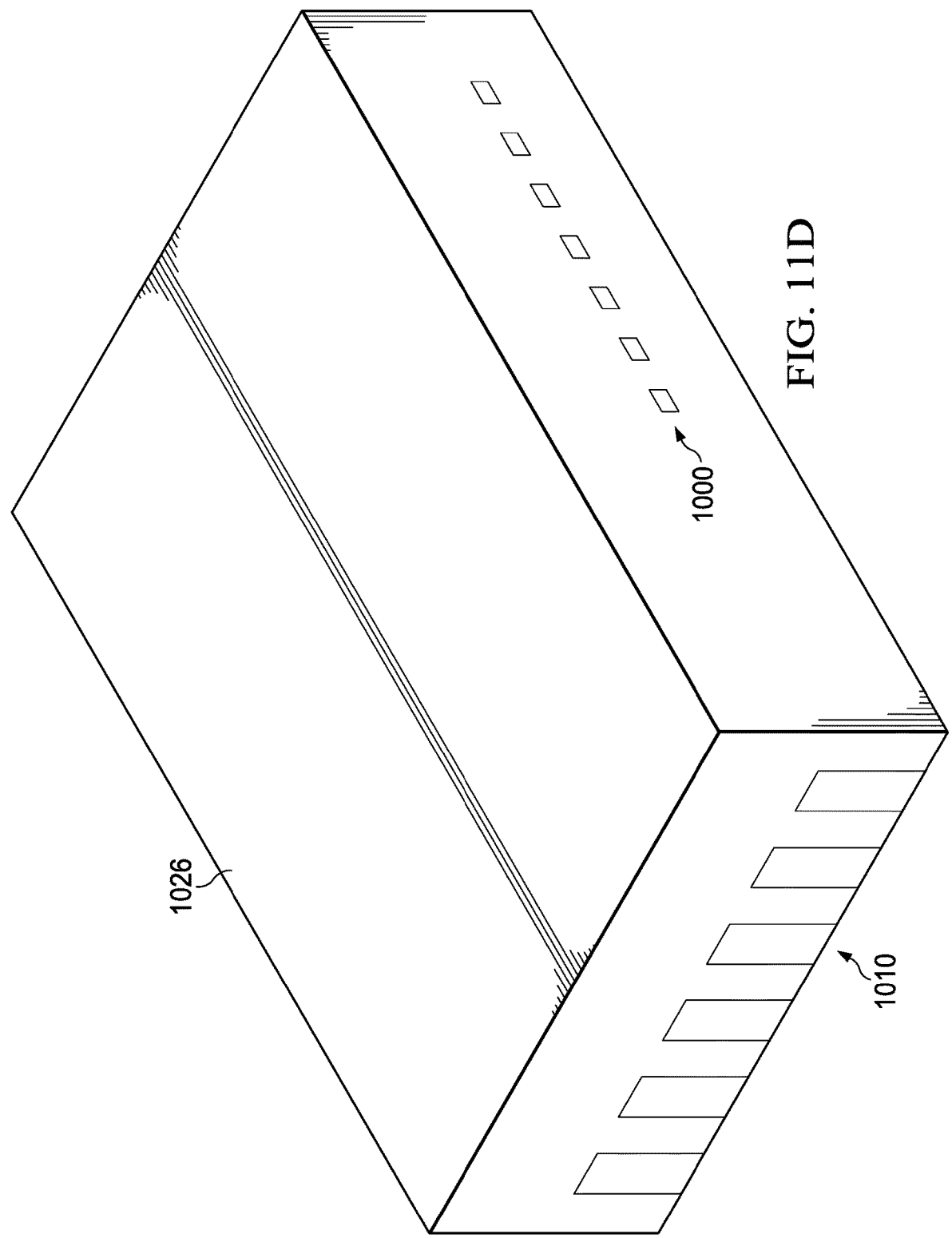
FIG. 11D depicts a perspective view of a package having multiple exposed leads, in accordance with various examples.

FIG. 11A depicts a perspective view of a die 1022 having electrical connectors 1024 extending from the die 1022. FIG. 11A also depicts the assembly shown in FIG. 10K. The electrical connectors 1024 are aligned with corresponding leads 1002, 1004, 1006. FIG. 11B is a perspective view of the assembly of FIG. 11A, but with the electrical connectors 1024 having been electrically coupled (e.g., using solder) to the leads 1002, 1004, 1006. FIG. 11B also depicts the assembly encapsulated in a molding 1026 (e.g., an epoxy), which is depicted as being translucent in this drawing to facilitate a view within the molding 1026. FIGS. 11C and 11D depict alternative perspective views of the completed package, with the set of leads 1010 exposed to a surface of the molding 1026 (i.e., exposed to a surface of the package), and the set of leads 1000 exposed to a different surface of the molding 1026 (i.e., exposed to a different surface of the package). In FIG. 11D, the assembly is turned upside down so that the top surface in FIG. 11C is the bottom surface in FIG. 11D.

The term "lead" as used herein is not restricted to any particular example or embodiment. For example, referring to FIG. 10I, a "lead" may refer to a stack that comprises the conductive member 1010; the non-solder and/or non-copper metal plating 1014 stacked on the conductive member 1010; the electroplated layer 1020 stacked on the non-solder and/or non-copper metal plating 1014; the non-solder and/or non-copper metal plating 1008 stacked on the electroplated layer 1020; and the conductive member 1000 stacked on the non-solder and/or non-copper metal plating 1008. As shown in, e.g., FIG. 10G, the conductive member 1000 may extend in multiple directions in a common plane, for example, to achieve a fan-out configuration. However, this is not necessarily the case, as the term "lead" may include the conductive member stack(s) depicted on the left side of FIG. 10I or the conductive member stack(s) depicted on the right side of FIG. 10I.

Figure 12:
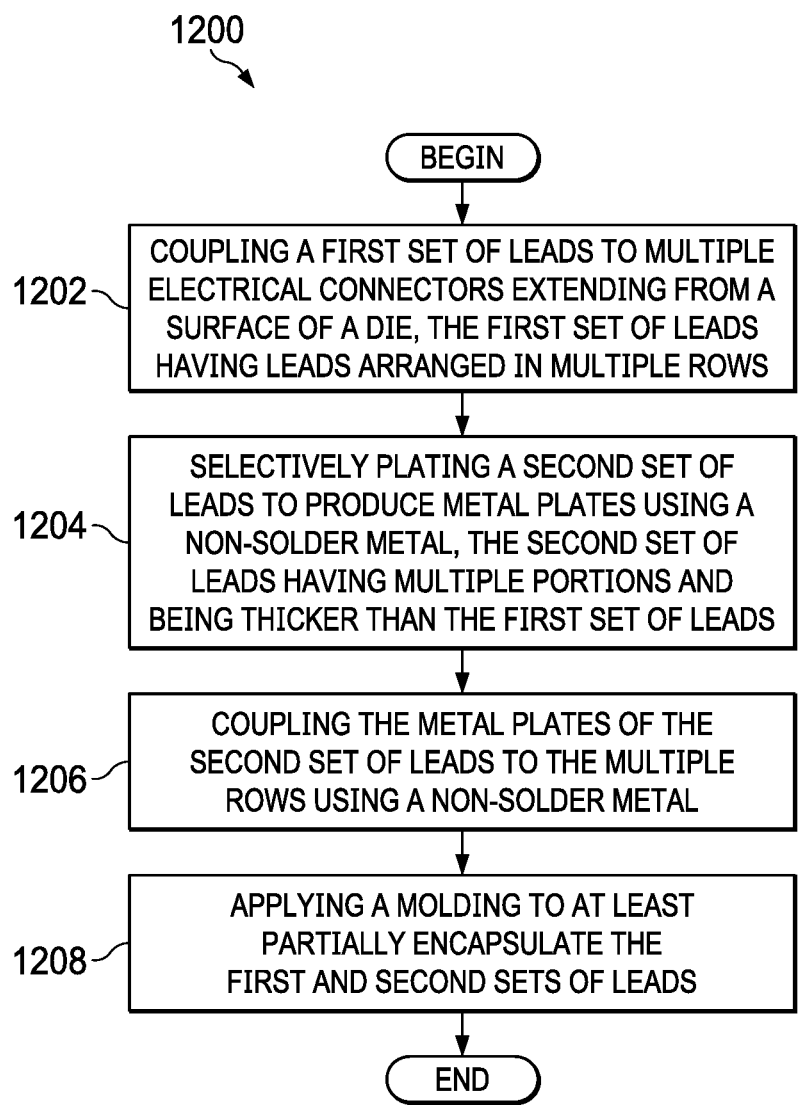
FIG. 12 depicts a flow diagram of a method of manufacture in accordance with various examples.

FIG. 12 depicts a flow diagram of a method 1200 of manufacture in accordance with various examples. The method 1200 may be used to manufacture one or more of the devices described above, or at least a part of one or more of the devices described above. The method 1200 begins by coupling a first set of leads to multiple electrical connectors extending from a surface of a die, where the first set of leads has leads arranged in multiple rows (step 1202). The method 1200 then comprises selectively plating a second set of leads to produce metal plates using a non-solder metal, the second set of leads having multiple portions and being thicker than the first set of leads (step 1204). The method 1200 then incudes coupling the metal plates of the second set of leads to the multiple rows using a non-solder metal (step 1206). The method 1200 additionally comprises applying a molding to at least partially encapsulate the first and second sets of leads (step 1208). The steps of the method 1200 may be performed in any suitable order and may be modified to add, modify, or remove one or more steps.

Figure 13:
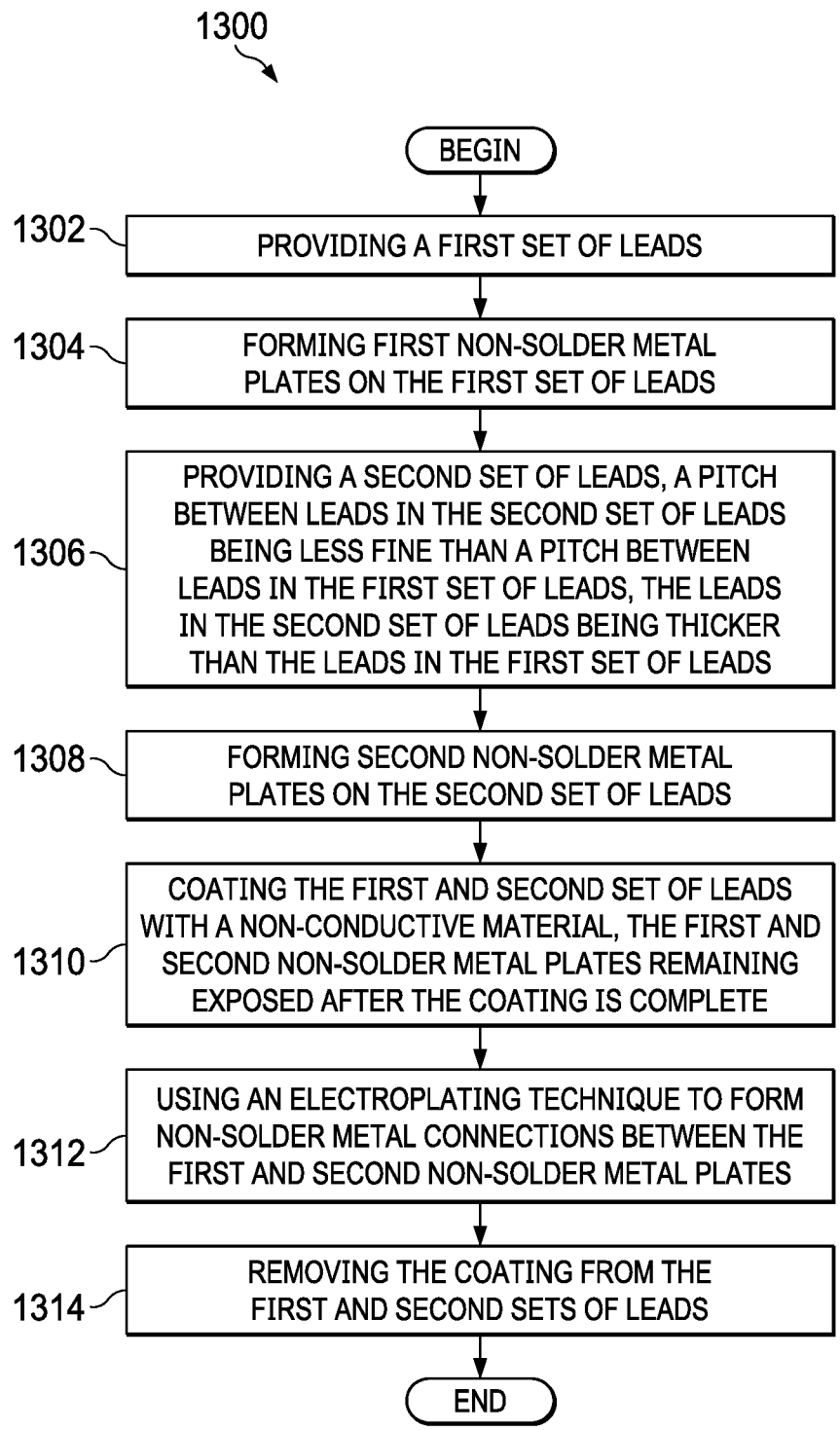
FIG. 13 depicts a flow diagram of another method of manufacture in accordance with various examples.

FIG. 13 depicts a flow diagram of a method 1300 of manufacture in accordance with various examples. The method 1300 may be used to manufacture one or more of the devices described above, or at least a part of one or more of the devices described above. The method 1300 begins with providing a first set of leads (step 1302). The method 1300 comprises forming first non-solder metal plates on the first set of leads (step 1304). The method 1300 comprises providing a second set of leads, where a pitch between the leads in the second set of leads is less fine than a pitch between the leads in the first set of leads, and where the leads in the second set of leads are thicker than the leads in the first set of leads (step 1306). The method 1300 next includes forming second non-solder metal plates on the second set of leads (step 1308). The method 1300 further comprises coating the first and second sets of leads with a non-conductive material, with the first and second non-solder metal plates remaining exposed after the coating is complete (step 1310). The method 1300 also includes using an electroplating technique to form non-solder metal connections between the first and second non-solder metal plates (step 1312). The method 1300 includes removing the coating from the first and second sets of leads (step 1314). The steps of method 1300 may be performed in any suitable order and may be modified by adding, modifying, or removing of one or more steps.

Figure 14:
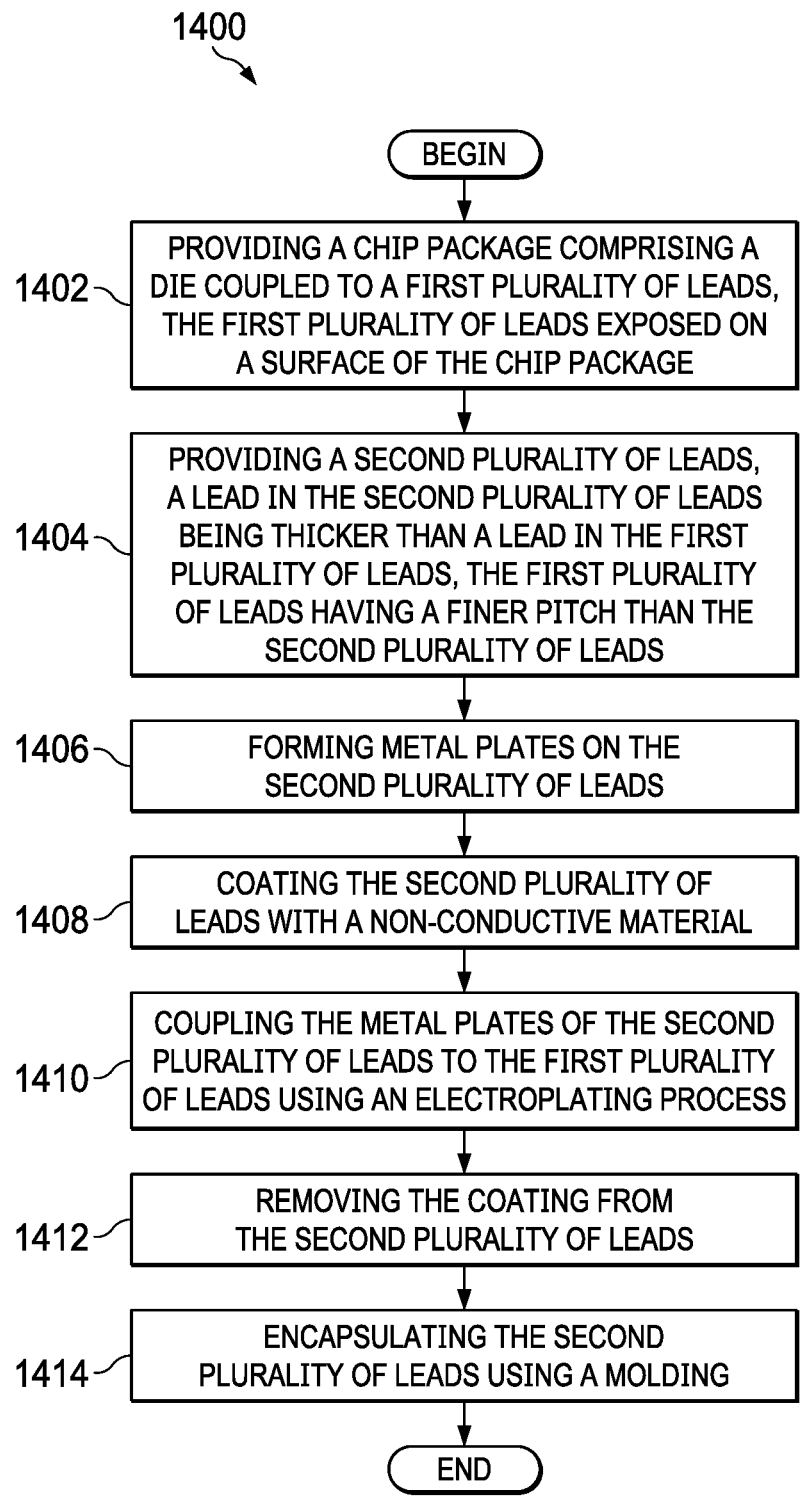
FIG. 14 depicts a flow diagram of another method of manufacture in accordance with various examples.

FIG. 14 depicts a flow diagram of a method 1400 of manufacture in accordance with various examples. The method 1400 may be used to manufacture one or more of the devices described above, or at least a part of one or more of the devices described above. The method 1400 begins with providing a chip package comprising a die coupled to a first plurality of leads, with the first plurality of leads exposed on a surface of the chip package (step 1402). The method 1400 then includes providing a second plurality of leads, a lead in the second plurality of leads being thicker than a lead in the first plurality of leads, with the first plurality of leads having a finer pitch than the second plurality of leads (step 1404). The method 1400 then comprises forming metal plates on the second plurality of leads (step 1406) and coating the second plurality of leads with a non-conductive material (step 1408). The method 1400 then comprises coupling the metal plates of the second plurality of leads to the first plurality of leads using an electroplating process (step 1410). The method 1400 then includes removing the coating from the second plurality of leads (step 1412). The method 1400 comprises encapsulating the second plurality of leads using a molding (step 1414). The steps of the method 1400 may be performed in any suitable order, and the method 1400 may be modified to add, modify, or remove one or more steps.

The various examples disclosed herein provide benefits in addition to the advantages described above. For instance, the differing lead pitches described above enable the use of dies with finer features than was previously possible in the power device context. In addition, the devices with multiple sets of leads enable the use of a greater variety of design rules, lead thicknesses, materials, and vendors within the supply chain. Such benefits, in turn, may provide other benefits; for example, the increased flexibility in design rules may result in lowered manufacturing costs relative to the costs that would otherwise be incurred. The various examples disclosed may provide additional advantages that are not expressly described herein.

In the foregoing discussion and in the claims, the terms "including" and "comprising" are used in an open-ended fashion, and thus should be interpreted to mean "including, but not limited to . . . . " Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A system comprising:
a die including multiple electrical connectors extending from a surface of the die;
a lead coupled to the multiple electrical connectors, the lead comprising:

a first conductive member;
a first non-solder metal plating stacked on the first conductive member;
an electroplated layer stacked on the first non-solder metal plating;
a second non-solder metal plating stacked on the electroplated layer; and
a second conductive member stacked on the second non-solder metal plating, the second conductive member being thinner than the first conductive member; and
a molding covering the die and the lead.

2. The system of claim 1, wherein the second conductive member has a greater volume than the first conductive member.

3. The system of claim 1, wherein the second conductive member is oriented orthogonally to the first conductive member.

4. The system of claim 1, wherein spacing between the first conductive member and a next conductive member in a common plane with the first conductive member is between 10 microns and 200 microns.

5. The system of claim 1, wherein the second conductive member extends in multiple directions in a common plane.

6. The system of claim 1, wherein the first and second non-solder metal platings are non-copper metal platings.

7. The system of claim 1, wherein the die comprises a power transistor, and wherein the first conductive member couples to one of a source lead or a drain lead of the power transistor.

8. The system of claim 1, wherein the non-solder metal is selected from the group consisting of: nickel; nickel palladium; nickel palladium gold; nickel tungsten; tin; tin gold; gold;
and silver.

9. The system of claim 1, wherein the electroplated layer comprises electroplated copper.

10. A system comprising:
a die including electrical connectors extending from a surface of the die, the electrical connectors arranged in multiple rows;
a first set of leads arranged in multiple rows, the multiple rows of leads coupled to the multiple rows of electrical connectors;
a second set of leads having first and second leads, the first lead coupled to alternating ones of the multiple rows of leads with a non-solder metal and the second lead coupled to other alternating ones of the multiple rows of leads with the non-solder metal, the first and second leads being thicker than the first set of leads; and
a molding covering the first and second sets of leads.

11. The system of claim 10, wherein each of the multiple rows in the first set of leads couples to a different one of the multiple rows of electrical connectors.

12. The system of claim 10, wherein the non-solder metal is positioned on the first and second leads in alignment with the multiple rows of leads.

13. The system of claim 10, further comprising an additional non-solder metal coupled to the non-solder metal.

14. The system of claim 10, wherein the first and second leads are exposed on a first surface of the molding.

15. The system of claim 10, wherein the first lead has a length that extends across all of the multiple rows of leads in the first set of leads.

16. A system comprising:
a die comprising multiple rows of electrical connectors;
a first plurality of leads, each lead in the first plurality of leads coupled to a different row of electrical connectors; and
a second plurality of leads positioned in a different plane than the first plurality of leads, a first lead in the second plurality of leads coupled to multiple, non-consecutive leads in the first plurality of leads with multiple non-solder metals, a second lead in the second plurality of leads coupled to other multiple, non-consecutive leads in the first plurality of leads with multiple non-solder metals,
wherein the first and second leads in the second plurality of leads are thicker than the leads in the first plurality of leads.

17. The system of claim 16, wherein a pitch between the leads in the first plurality of leads ranges between 10 microns and 200 microns.

18. The system of claim 16, wherein the multiple non-solder metals are the same.

19. A method comprising:
coupling a first set of leads to multiple electrical connectors extending from a surface of a die, the first set of leads having leads arranged in multiple rows;
selectively plating a second set of leads to produce metal plates using a non-solder metal, the second set of leads having multiple portions and being thicker than the first set of leads;
coupling the metal plates of the second set of leads to the first set of leads in multiple rows using the non-solder metal; and
applying a molding to at least partially encapsulate the first and second sets of leads.

20. The method of claim 19, further comprising applying an insulating coat to the second set of leads, the metal plates remaining exposed after the application of the insulating coat.

21. The method of claim 20, further comprising:
placing the first and second sets of leads in an electroplating bath;
applying current to the second set of leads to produce non-solder metal connections between the metal plates and the leads in the first set of leads; and
stripping the insulating coat off of the second set of leads.

22. A method comprising:
providing a first set of leads;
forming first non-solder metal plates on the first set of leads;
providing a second set of leads, a pitch between leads in the second set of leads being less fine than a pitch between leads in the first set of leads, the leads in the second set of leads being thicker than the leads in the first set of leads;
forming second non-solder metal plates on the second set of leads;
coating the first and second sets of leads with a non-conductive material, the first and second non-solder metal plates remaining exposed after the coating is complete;
using an electroplating technique to form non-solder metal connections between the first and second non-solder metal plates; and
removing the coating from the first and second sets of leads.

23. The method of claim 22, wherein one of the leads in the second set of leads has a length extending across the first set of leads.

24. A method comprising:
- providing a package comprising a die coupled to a first plurality of leads, the first plurality of leads exposed on a surface of the package;
- providing a second plurality of leads, a lead in the second plurality of leads being thicker than a lead in the first plurality of leads, the first plurality of leads having a finer pitch than the second plurality of leads;
- forming metal plates on the second plurality of leads;
- coating the second plurality of leads with a non-conductive material;
- coupling the metal plates of the second plurality of leads to the first plurality of leads using an electroplating process;
- removing the coating from the second plurality of leads; and
- encapsulating the second plurality of leads using a molding.

25. The method of claim 24, wherein the lead in the second plurality of leads has a length extending across the first plurality of leads.

* * * * *